(12) United States Patent
Oohata et al.

US006972204B2

(10) Patent No.: US 6,972,204 B2
(45) Date of Patent: Dec. 6, 2005

(54) METHOD OF TRANSFERRING DEVICES, METHOD OF ARRANGING DEVICES USING THE SAME, AND METHOD OF MANUFACTURING AN IMAGE DISPLAY SYSTEM

(75) Inventors: Toyoharu Oohata, Kanagawa (JP); Toshiaki Iwafuchi, Kanagawa (JP); Hisashi Ohba, Kanagawa (JP)

(73) Assignee: Sony Corporation, Tokyo (JP)

( * ) Notice: Subject to any disclaimer, the term of this patent is extended or adjusted under 35 U.S.C. 154(b) by 275 days.

(21) Appl. No.: 10/236,153

(22) Filed: Sep. 6, 2002

(65) Prior Publication Data

US 2003/0087476 A1 May 8, 2003

(30) Foreign Application Priority Data

Sep. 6, 2001 (JP) ..................... P2001-270218

(51) Int. Cl.$^7$ .......................... H01L 21/20; H01L 21/44
(52) U.S. Cl. .......................... 438/22; 438/108; 438/458; 438/464
(58) Field of Search ..................... 438/22–47, 108–127, 438/455–465, 977

(56) References Cited

U.S. PATENT DOCUMENTS

| | | | |
|---|---|---|---|
| 5,206,749 A | | 4/1993 | Zavracky et al. |
| 5,258,320 A | | 11/1993 | Zavracky et al. |
| 5,438,241 A | | 8/1995 | Zavracky et al. |
| 5,739,800 A | | 4/1998 | Lebby et al. |
| 5,827,751 A | * | 10/1998 | Nuyen ........................... 438/28 |
| 6,656,819 B1 | * | 12/2003 | Sugino et al. ............... 438/460 |
| 6,670,206 B2 | * | 12/2003 | Kim et al. ..................... 438/26 |
| 6,683,416 B1 | * | 1/2004 | Oohata et al. ............ 315/169.3 |
| 6,744,800 B1 | * | 6/2004 | Kneissl et al. ................ 372/50 |
| 2002/0096994 A1 | * | 7/2002 | Iwafuchi et al. ............ 313/495 |
| 2002/0115265 A1 | * | 8/2002 | Iwafuchi et al. ............ 438/458 |
| 2002/0171089 A1 | * | 11/2002 | Okuyama et al. ............. 257/88 |
| 2003/0011377 A1 | * | 1/2003 | Oohata et al. ............... 324/512 |
| 2003/0034120 A1 | * | 2/2003 | Yanagisawa et al. ........ 156/238 |
| 2003/0162463 A1 | * | 8/2003 | Hayashi et al. ................ 445/24 |

FOREIGN PATENT DOCUMENTS

| | | |
|---|---|---|
| EP | 0 905 673 A1 | 3/1999 |
| JP | 50-13878 | 2/1975 |
| JP | 51-24534 | 2/1976 |
| JP | 56-061468 | 5/1981 |
| JP | 56-061469 | 5/1981 |
| JP | 60-181778 | 9/1985 |
| JP | 60-252681 | 12/1985 |
| JP | 04-010671 | 1/1992 |
| JP | 04-247486 | 9/1992 |

(Continued)

OTHER PUBLICATIONS

Applied Physics Letters, vol. 76, No. 22, May 29, 2000, Selective growth of InGaN quantum dot structures and their microphotoluminescence at room temperature, Tachibani et al., pp. 3212–3214.

*Primary Examiner*—Savitri Mulpuri
(74) *Attorney, Agent, or Firm*—Bell, Boyd & Lloyd LLC

(57) ABSTRACT

A first adhesive layer is provided on a base substrate, and multiple devices are arranged on the first adhesive layer. The first adhesive layer is irradiated with laser light from the back side of the base substrate, only at positions corresponding to the devices to be transferred, by use of a mask, whereby the adhesive force of the first adhesive layer is lowered only at these positions, and only these devices are made releasable from the base substrate. A transfer substrate provided with a second adhesive layer and the base substrate are so disposed that the devices and the second adhesive layer are opposite to each other and pressed against each other. When the transfer substrate is stripped from the base substrate, only the devices to be transferred are selectively transferred onto the transfer substrate.

4 Claims, 21 Drawing Sheets

FOREIGN PATENT DOCUMENTS

| | | |
|---|---|---|
| JP | 05-290669 | 11/1993 |
| JP | 05-315643 | 11/1993 |
| JP | 07-110660 | 4/1995 |
| JP | 07-263754 | 10/1995 |
| JP | 08-264841 | 10/1996 |
| JP | 09-293904 | 11/1997 |
| JP | 10-070151 | 3/1998 |
| JP | 10-163536 | 6/1998 |
| JP | 10-173305 | 6/1998 |
| JP | 10-256694 | 9/1998 |
| JP | 10-305620 | 11/1998 |
| JP | 11-008338 | 1/1999 |
| JP | 11-126037 | 5/1999 |
| JP | 11-142878 | 5/1999 |
| JP | 11-219146 | 8/1999 |
| JP | 2000-089693 | 3/2000 |
| JP | 2000-169808 | 6/2000 |
| JP | 2000-248240 | 9/2000 |
| WO | WO 95/05623 | 2/1995 |

\* cited by examiner

FIG.1A
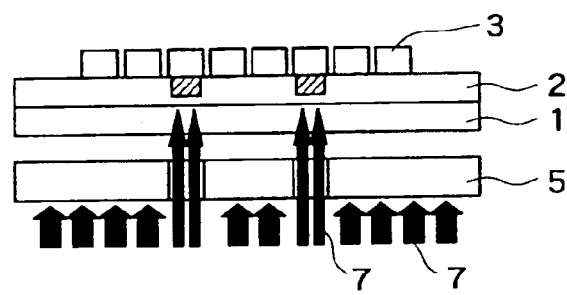
FIG.1B
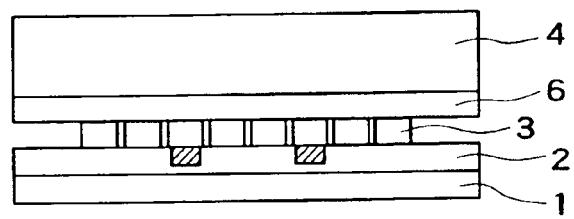
FIG.1C
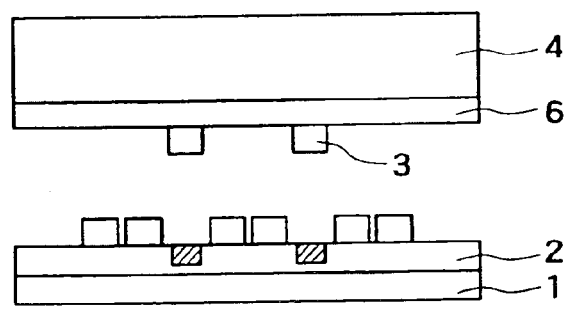

FIG. 3A
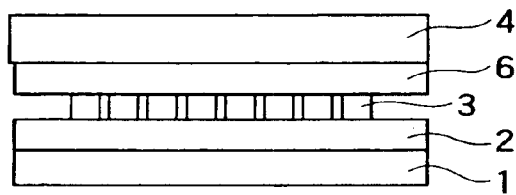
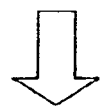
FIG. 3B
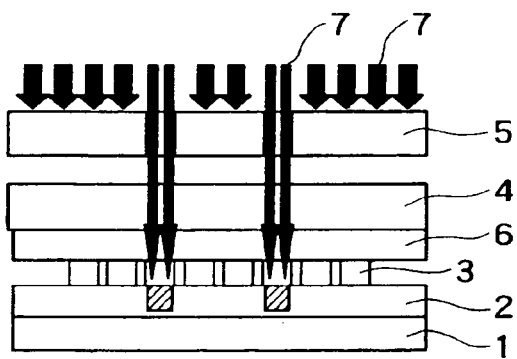
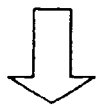
FIG. 3C
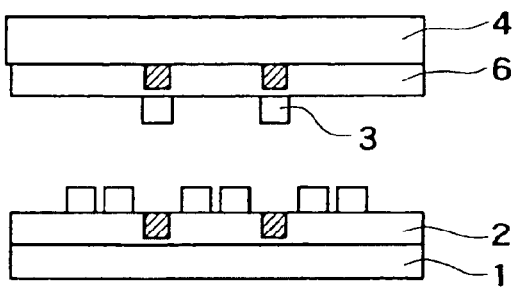

FIG. 5A
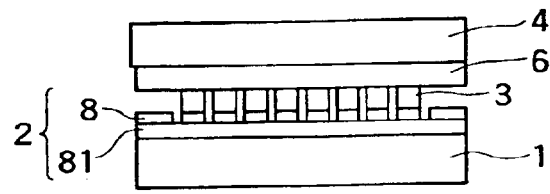
FIG. 5B
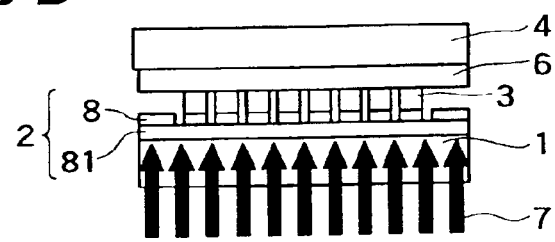
FIG. 5C
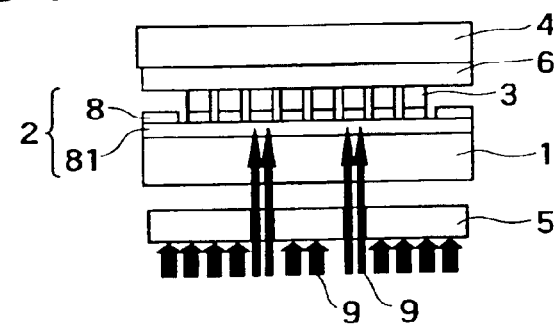
FIG. 5D
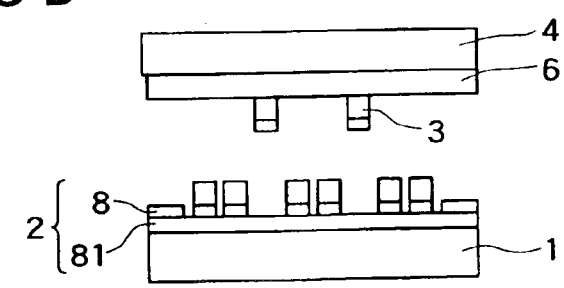

FIG. 6A
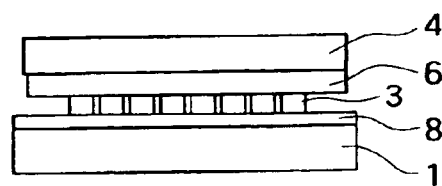
FIG. 6B
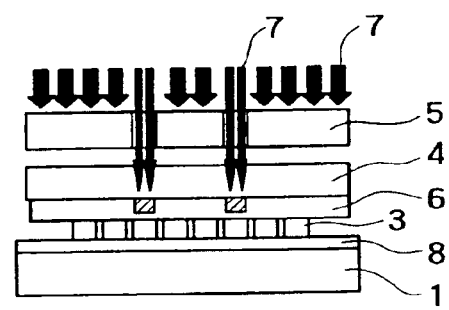
FIG. 6C
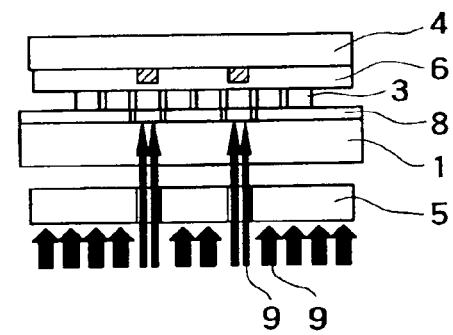
FIG. 6D
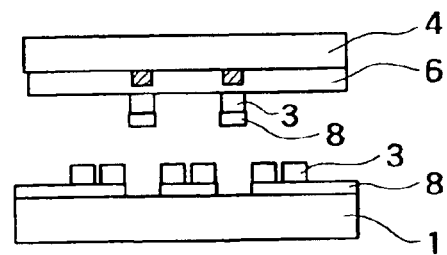

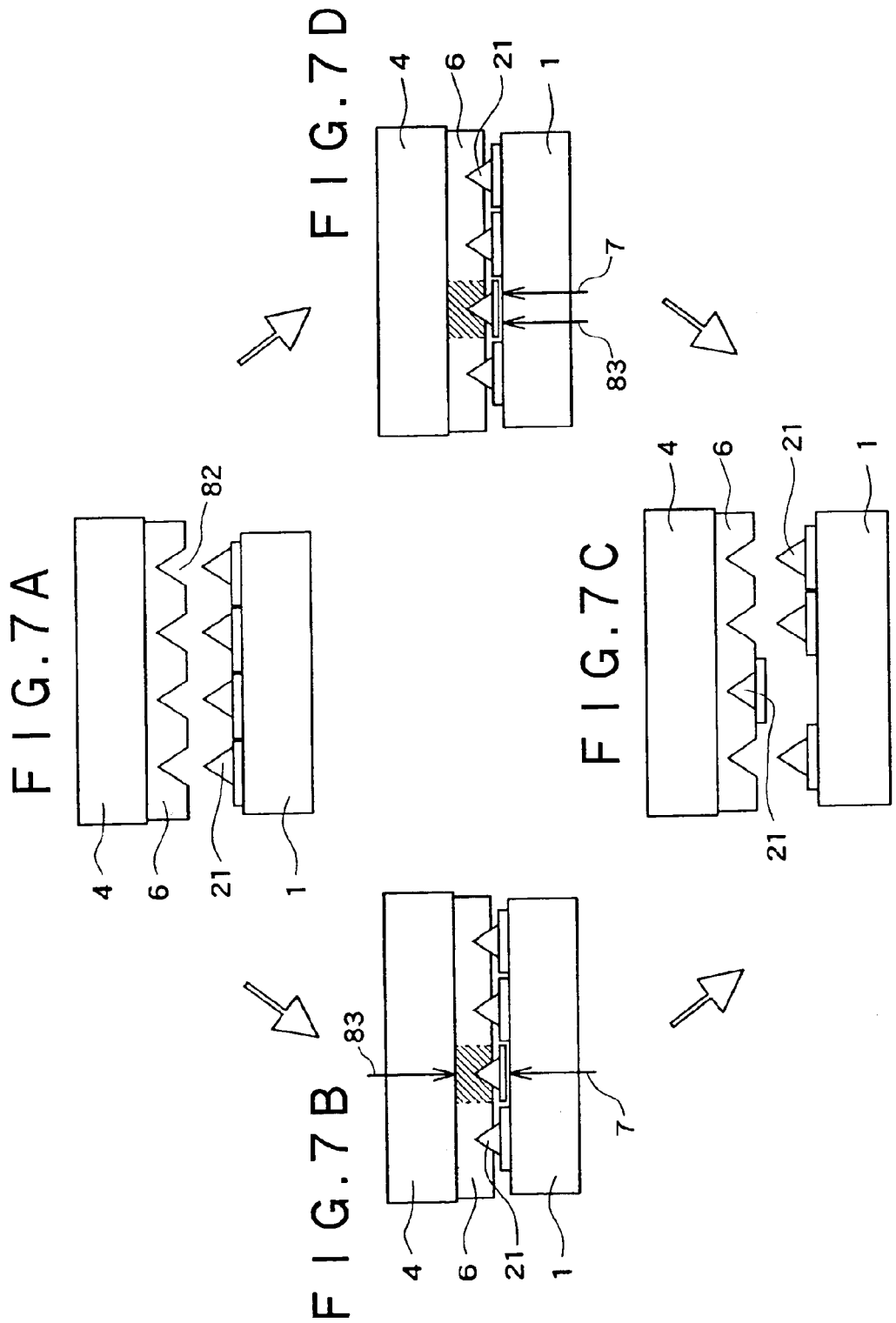

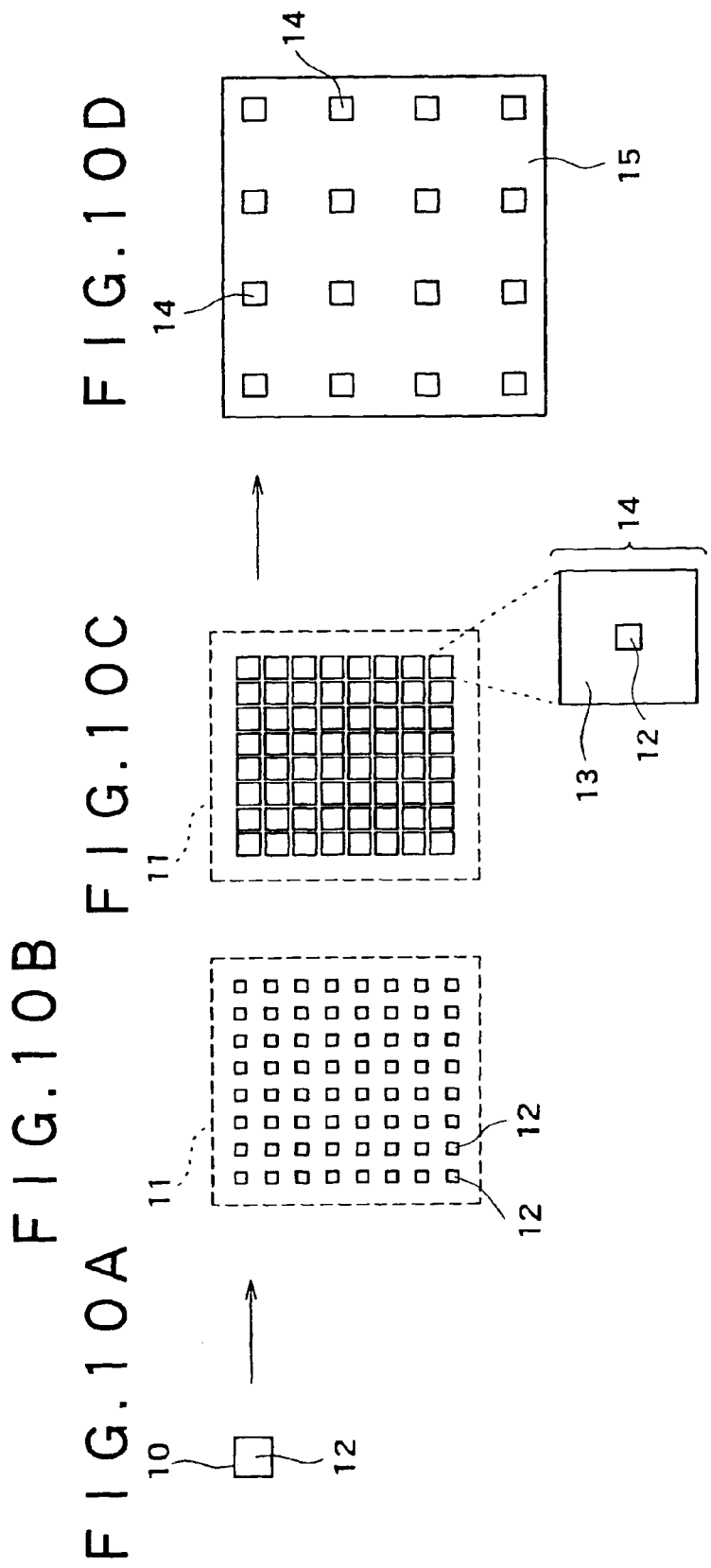

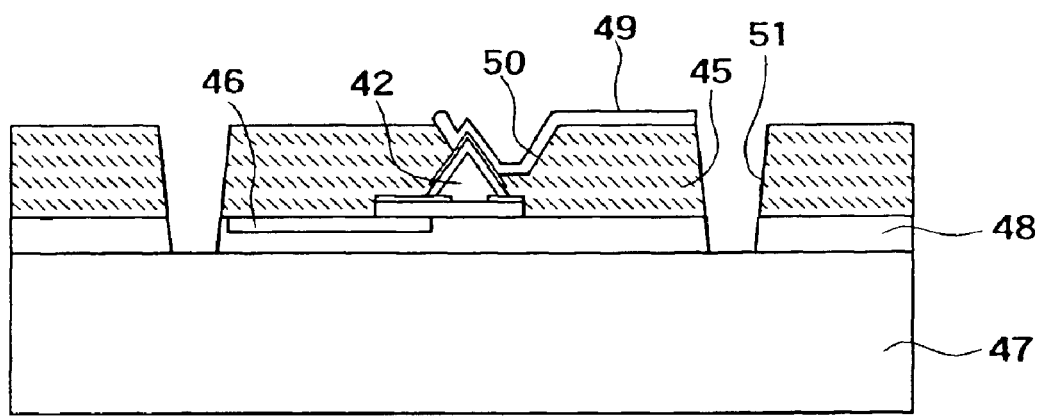
F I G. 1 6

F I G. 17
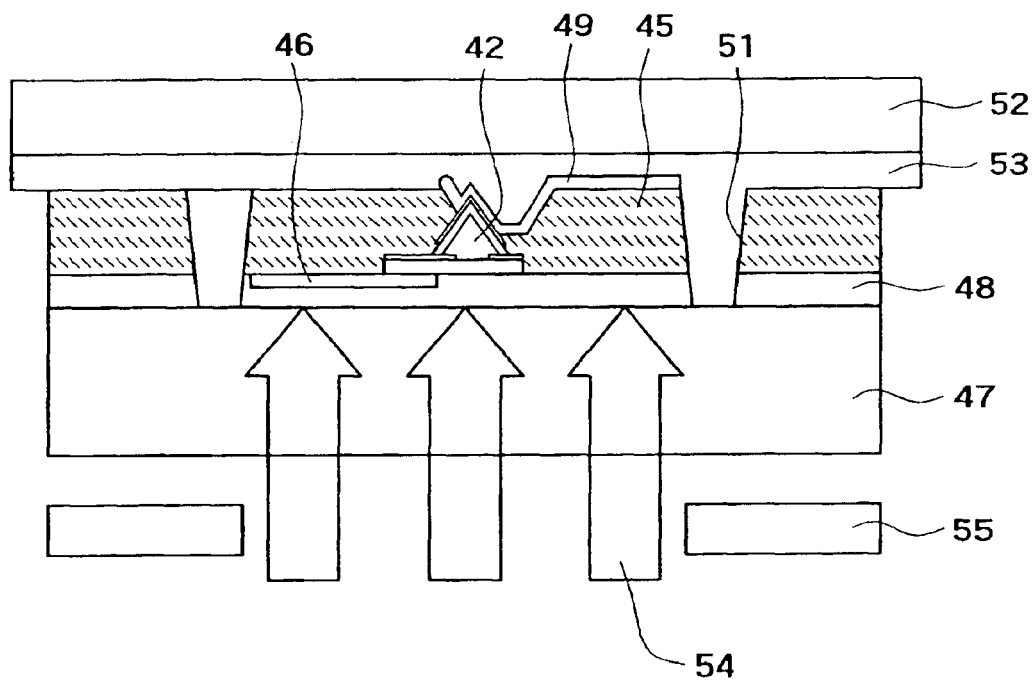

METHOD OF TRANSFERRING DEVICES, METHOD OF ARRANGING DEVICES USING THE SAME, AND METHOD OF MANUFACTURING AN IMAGE DISPLAY SYSTEM

BACKGROUND OF THE PRESENT INVENTION

The present invention relates to a method of transferring a device or devices such as semiconductor light-emitting devices, a method of arranging devices for transferring the finely processed devices to a wider region by application of the transferring method, and a method of manufacturing an image display system.

At present, electronic apparatuses or the like are manufactured with a multiplicity of fine devices, electronic component parts, electronic devices, electronic component parts obtained by embedding these devices in an insulator such as a plastic or a similar material. For example, in the case of arranging light-emitting devices in a matrix form to assemble an image display system, a method of forming the devices directly on a substrate has been adopted such as a liquid crystal display (LCD), a plasma display panel (PDP) or a method of arranging single LED packages as in the case of a light-emitting diode display (LED display).

Here, in the case of the image display system such as the LCD and PDP, the device cannot be isolated, so a method of forming the devices at intervals equivalent to the pixel pitch of the image display system from the beginning of the production process has generally been adopted.

In the case of the LED display, a method is used which takes out the LED chips after dicing, connects the individual LED chips to external electrodes by wire bonding or bump connection using flip chips, and then packages the LED chips. In this case, the LED chips are arranged at the pixel pitch of the image display system before or after the packaging, and the pixel pitch has no relation with the pitch at which the devices are formed.

Since the LEDs (light-emitting diodes), which are light-emitting devices, are expensive, a multiplicity of LED chips are produced from a single wafer, whereby the image display system using the LEDs can be manufactured at a lower cost. Namely, by forming the LED chips (conventionally about 300 $\mu$m square in size) in a size of about several tenths of a $\mu$m square and then connecting them to manufacture an image display system, the cost of the image display system is lowered.

In view of the above, one known method includes the steps of forming the devices at a high degree of integration, and moving the devices while spacing the devices further apart into a wider region by transferring or the like. Therefore, a comparatively larger display system such as an image display system is constituted. For example, in one known method shown in FIG. 21A, devices 93 are arranged on an adhesive layer 92 on a base substrate 91, and then, as shown in FIG. 21B, one of the devices 93 is taken out by use of a suction head 94, and is put on an adhesive layer 96 on another substrate 95.

In the case of manufacturing an image display system by the transferring method described above, the devices must be transferred securely. In addition, the devices must be transferred and with efficiency and a high degree of accuracy.

When the above-mentioned method is used, however, the transfer requires several steps, namely, taking-out or removing the device with the suction head, moving the device, and then mounting the device on a substrate, so that the transferring step is intricate. In addition, where the device to be transferred is a complex device, it is very difficult to take out only the desired device by such a method.

Besides, in an actual mounting machine, the positioning precision at the time of arranging the devices is limited to about 10 $\mu$m, and therefore, it is difficult to further enhance the positioning precision.

SUMMARY OF THE INVENTION

The present invention has been made in consideration of the above prior art methods and apparatuses. Accordingly, the present invention provides a method of transferring a device or devices efficiently and with high accuracy, provides a method of arranging devices, and a method of manufacturing an image display system.

In one embodiment of the present invention, a method of transferring a device or devices which includes the steps of making the device or devices to be transferred releasable from a first substrate and transferring the releasable device or devices from the first substrate onto a second substrate including an adhesive layer.

In the method of transferring a device or devices according to the present invention, of the number of devices arranged and fixed on the first substrate, only the device or devices to be transferred are made to be releasable from the first substrate. Then, only the device or devices thus made releasable are transferred onto the second substrate including the adhesive layer. According to the method of transferring a device or devices, therefore, only the device or devices to be transferred can be transferred from the first substrate onto the second substrate and secured to the second substrate with high accuracy.

In addition, by making the devices to be transferred releasable, the desired devices can be transferred in one transfer step, so that it is possible to selectively and efficiently transfer the device or devices in a short time.

In accordance with another embodiment of the present invention, a method of arranging devices is provided for rearranging a number of devices on a first substrate onto a second substrate, including the steps of: transferring the devices to a first temporary holding member so that the devices are spaced wider apart compared with the spacing of the devices on the first substrate; fixing the devices on the first temporary holding member with a resin; dicing the resin on a device basis to separate the resin-fixed devices; and transferring the devices held on the first temporary holding member and fixed with the resin, onto a second substrate while spacing the devices further apart from each other. In this embodiment, the second transferring step includes the steps of making the devices releasable from a second temporary holding member, and transferring the devices from the second temporary holding member onto the second substrate including an adhesive layer.

In the method of arranging the devices according to the present invention, the devices all transferred efficiently and securely by using the above-mentioned transferring method, so that the transferring of the devices while enlarging the spaced intervals of the devices can be carried out smoothly.

In accordance with a further embodiment of the present invention, a method of manufacturing an image display system is provided including a number of light-emitting devices arranged in a matrix form, the method including the steps of: transferring the light-emitting devices to a first temporary holding member so that the devices are spaced wider apart from each other as compared with the spacing of the devices on a first substrate; fixing the light-emitting devices on the first temporary holding member with a resin; dicing the resin on a light-emitting device basis to separate the resin-fixed light-emitting devices; and transferring the light-emitting devices on the first temporary holding member fixed with the resin onto a second substrate while spacing the light-emitting devices further apart from each other. The second transferring step includes the steps of making the light-emitting devices releasable from a second temporary holding member to be transferred, and transferring the releasable light-emitting devices from the second temporary holding member onto the second substrate including an adhesive layer.

According to the above method of manufacturing an image display system of the present invention, the light-emitting devices are arranged in a matrix form by the above-mentioned transferring method and arranging method, whereby an image display portion is constituted. Therefore, the light-emitting devices fabricated with fine or complex processing in a dense condition, namely, at a high degree of integration, can be efficiently rearranged while being spaced wider apart from each other, whereby productivity is greatly enhanced.

Additional features and advantages of the present invention are described in, and will be apparent from, the following Detailed Description of the Invention and the Figures.

BRIEF DESCRIPTION OF THE FIGURES

FIGS. 1A to 1C are sectional views illustrating an example of a transfer process according to one embodiment of the present invention.

FIGS. 3A to 3C are sectional views illustrating an example of a transfer process according to a further embodiment the present invention.

FIGS. 5A to 5D are sectional views illustrating an example of a transfer process according to a further embodiment of the present invention.

FIGS. 6A to 6D are sectional views illustrating an example of a transfer process according to another embodiment of the present invention.

FIGS. 7A to 7D are sectional views illustrating an example of a transfer according to a further embodiment of the present invention.

FIGS. 10A to 10D are schematic diagrams showing a method of arranging the devices.

FIG. 16 is a sectional view showing a step of forming electrode pads after transfer onto a second temporary holding member.

FIG. 17 is a sectional view showing a second transferring step.

DETAILED DESCRIPTION OF THE PRESENT INVENTION

Figure 2A:
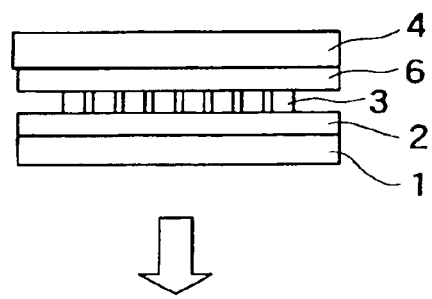
FIGS. 2A to 2D are sectional views illustrating an example of a transfer process according to another embodiment of the present invention.

A method of transferring a device or devices, a method of arranging devices, and a method of manufacturing an image display system according to the present invention will be described in detail below referring to the drawings.

First, the method of transferring a device or devices which is fundamental to the present invention will be described. In the present invention, the method of transferring a device or devices includes the steps of making the device or devices releasable from a first substrate transferring the releasable device or devices from the first substrate onto a second substrate including an adhesive layer. Namely, in the present invention, of the number of devices arranged and fixed on the first substrate, the device or devices transferred are releasable from the first substrate and are the transferred. The method of transferring a device or devices will be described in detail based on the following embodiments.

FIG. 1 shows a first embodiment of the method of transferring a device or devices according to the present invention. In order to transfer the devices 3 by application of the present invention, a first adhesive layer 2 is formed on a base substrate 1 functioning as a supply source and a number of devices 3 are arranged and formed thereon, as shown in FIG. 1A.

The base substrate 1 is not particularly limited, and may be formed of an arbitrary material, taking into consideration the combination with the devices 3 and the like. It is noted, however, that since the first adhesive layer 2, which is formed on the base substrate 1, is heated as will be described later, the base substrate 1 is formed of a material which shows sufficient heat resistance and has a low expansion property. In addition, since irradiation with UV laser light 7 from the back side of the base substrate 1 is required at the time of transferring the devices 3, the base substrate 1 must have a light transmitting property.

The first adhesive layer 2 is a layer on which the devices 3 can be adhered and fixed at the time of arranging and forming the devices 3 and from which the devices 3 can be released at the time of subsequently taking out the devices 3 from the base substrate 1. The first adhesive layer 2 is formed on the base substrate 1, and the devices 3 are arranged and formed on the first adhesive layer 2, whereby the devices 3 can be easily taken out. Such a first adhesive layer 2 is preferably formed, for example, by use of a thermoplastic material, and a sheet of a thermoplastic resin or a heat-releasable material or the like is preferably used. Where the thermoplastic resin is used, heating the first adhesive layer 2 plasticizes the thermoplastic resin, whereby adhesive force between the first adhesive layer 2 and the devices 3 is lowered, and the devices 3 are easily released from the layer. A heat-releasable material means a material which the tack can be lowered through a foaming or expansion process by heating and from which the adhered device or devices can be released easily. Namely, the heat-releasable material is a material such that a foaming agent or an expansion agent contained in the material creates a foam or expands upon heating, whereby the adhesion surface area is reduced and the adhesive force is thereby lost. Concrete examples of this include a heat-releasable type pressure sensitive adhesive sheet in which a pressure sensitive adhesive layer containing a foaming agent is provided on a base, as described in Japanese Patent Publication No. Sho 50-13878 and 51-24534, Japanese Patent Laid-open No. Sho 56-61468, 56-61469, 60-252681 and the like, a heat-releasable type pressure sensitive adhesive sheet including a non-heat-expandable pressure sensitive adhesive layer on at least one side of a heat-expandable layer which contains heat-expandable microspheres and expands on heating, as described in Japanese Patent Laid-open No. 2000-248240, a heat-releasable type pressure sensitive adhesive sheet in which a heat-expandable layer containing heat-expandable microspheres and a pressure sensitive adhesive layer containing a pressure sensitive adhesive material are provided on at least one side of a base, as described in Japanese Patent Laid-open No. 2000-169808, and a heat-releasable type adhesive sheet whose base has heat resistance and expansion-contraction properties.

Furthermore, the first adhesive layer 2 may have a constitution in which a release layer is provided on a base substrate 1 and a pressure sensitive adhesive layer is provided on the release layer. The release layer may be formed, for example, by use of a fluoro coat, a silicone resin, a water-soluble adhesive (for example, PVA), a polyimide or the like. For the pressure sensitive adhesive layer, for example, a UV pressure sensitive adhesive whose tack is lowered upon irradiation with UV rays may be used. With the adhesive layer thus constituted, irradiation with, for example, excimer laser is conducted from the back side of the base substrate 1. For example, where a quartz substrate is used as the base substrate 1 and the first adhesive layer 2 is formed of a polyimide, exfoliation is generated at the interface between the polyimide and the quartz substrate through ablation of the polyimide, making it possible to release the devices 3.

The first adhesive layer 2 is not limited to the above-mentioned embodiments. As described above, the only requirement is that the devices 3 can be adhered and fixed at the time of arranging and forming the devices 3 and the devices 3 can again be released at the time of subsequently taking out the devices 3 from the base substrate 1. Therefore, a pressure sensitive adhesive layer having such a low tack as to simply hold the devices 3 on the base substrate 1 may be used. The case where the first adhesive layer 2 is formed of a thermoplastic resin is described below.

The device 3 may be an arbitrary device. Examples of the device 3 include a light-emitting device, a liquid crystal control device, a photo-electric conversion device, a piezo-electric device, a thin film transistor device, a thin film diode device, a resistance device, a switching device, a micro magnetic device, a micro optical device, and any other similar devices. In the present invention, an electronic component part obtained by embedding the above-mentioned device in an insulator such as a plastic to form a chip is also included in the examples of the device. Namely, the present invention can not only be applied to the above-mentioned devices but also applied widely to electronic component parts such as chips. The devices in the present invention include chips such as LIP (LED In Plastic), where the invention is preferably applied to LIP.

At the time of transferring, as shown in FIG. 1A, where the devices 3 are arranged and fixed on the base substrate 1, the first adhesive layer 2 is irradiated with UV laser light 7 from the back side of the base substrate 1, namely, from a major surface on the side opposite to the side where the devices 3 are arranged and fixed. In this case, only the first adhesive layer 2 at positions corresponding to the devices 3 is selectively irradiated with the UV laser light 7 by use of a mask 5. Here, the mask 5 is provided with laser light transmission holes for allowing passage of the laser light only at the positions corresponding to the devices 3 to be transferred, at predetermined intervals, so that the UV laser light 7 incident on the other positions than the laser light transmission holes is shielded. By the irradiation with the UV laser light 7 and the use of such a mask 5, the first adhesive layer 2 is heated by the UV laser light 7 and thereby plasticized only at the positions corresponding to the devices 3 to be transferred, whereby the adhesive force between the first adhesive layer 2 and the devices 3 to be transferred is lowered. As a result, only the devices 3 to be transferred are releasable from the base substrate 1.

Next, as shown in FIG. 1B, a transfer substrate 4 including a second adhesive layer 6 on a major surface, which is the transfer surface side for the devices 3 and the base substrate 1, are disposed in a desired positional relationship, with the devices 3 and the second adhesive layer 6 opposed to and making contact with each other, and the devices 3 and the second adhesive layer 6 pressing against each other.

Here, the transfer substrate 4 may be formed of an arbitrary material taking into consideration the combination with the devices 3, use thereof and the like.

The second adhesive layer 6 is not particularly limited, and a material capable of adhering the devices 3 to the transfer substrate 4 can be used. For example, thermosetting resins and UV-curable resins are preferably used. The second adhesive layer 6 may be formed on the entire surface of the transfer surface of the transfer substrate 4, or may be formed partially at positions on the transfer surface corresponding to the devices.

The case of using a UV-curable resin as the material of the second adhesive layer 6 will be described below. Here, the combination of the first adhesive layer 2 and the second adhesive layer 6 is selected so that the tack between the second adhesive layer 6 (before curing by the UV laser light 7) and the devices 3 is greater than the adhesive force between the first adhesive layer 2 plasticized by the irradiation with the UV laser light 7 and the devices 3. Namely, a combination of the first adhesive layer 2 and the second adhesive layer 6 such that A<B is selected, where A is the adhesive force between the first adhesive layer 2 plasticized by irradiation with the UV laser light 7 and the devices 3, and B is the tack between the second adhesive layer 2 before curing by the UV laser light 7 and the devices 3. With such a combination, the devices 3 can be transferred from the base substrate 1 onto the transfer substrate 4 when the transfer substrate 4 is stripped from the base substrate 1 as will be described later.

Here, the adhesive force between the first adhesive layer 2 and the devices 3 need not be completely lost, and it suffices that A<B when the base substrate 1 and the transfer substrate 4 are disposed in contact with each other as described above. Namely, the tack between the second adhesive layer 6 before UV curing and the devices 3 is set to be greater than the adhesive force between the first adhesive layer 2 and the devices 3, whereby the devices 3 can be transferred from the base substrate 1 onto the transfer substrate 4 when the transfer substrate 4 is stripped from the base substrate 1 as will be described later.

For transferring the devices 3 more securely, it is preferable to select the combination of the first adhesive layer 2 and the second adhesive layer 6 so that the tack between the second adhesive layer 6 before UV curing and the devices 3 is much greater than the adhesive force between the first adhesive layer 2 and the devices 3.

Then, as shown in FIG. 1B, the base substrate 1 and the transfer substrate 4 are pressed against each other in the predetermined positional relationship for a predetermined period of time, whereby the devices 3 are fixed on the second adhesive layer 6 by the tack of the second adhesive layer 6. Then, the transfer substrate 4 is stripped from the base substrate 1, whereby the devices 3 are transferred from the base substrate 1 onto the transfer substrate 4. FIG. 1C shows the condition where the transfer substrate 4 has been stripped from the base substrate 1, in which the devices 3 have been transferred onto the second adhesive layer 6. Finally, the second adhesive layer 6 is irradiated with the UV laser light 7 and is thereby melted, followed by cooling to normal temperature, whereby the devices 3 are securely fixed on the transfer substrate 4, and the transfer is completed. By these operations, the devices 3 can be selectively transferred from the base substrate 1 onto the transfer substrate 4.

In the method of transferring devices according to the present invention as described above, the first adhesive layer 2 is selectively irradiated with the UV laser light 7 only at the positions corresponding to the devices 3 to be transferred using the mask 5. With such selective irradiation with the UV laser light 7, the first adhesive layer 2 can be plasticized by heating the layer with the UV laser light 7 only at the positions corresponding to the devices 3 to be transferred, whereby the adhesive force between the first adhesive layer 2 and the devices 3 to be transferred is lowered. As a result, only the devices 3 to be transferred are releasable from the base substrate 1, and only the desired devices 3 are transferred onto the transfer substrate 4.

In this method of transferring the devices 3, therefore, the devices 3 arranged and fixed on the base substrate 1 are selectively made releasable from the substrate, and only the releasable devices are transferred, whereby only the desired devices 3 are selectively transferred onto the transfer substrate 4, and the transfer of the devices 3 is performed efficiently.

Conventionally, the transfer of the devices 3 has been conducted by a method in which the devices 3 are released and transferred by utilizing the difference between the adhesive force between the adhesive layer on the base substrate 1 side and the devices, and the adhesive force between the adhesive layer on the transfer substrate 4 side and the devices. In that case, however, an orthogonal force on the adherend surface between the adhesive layer on the base substrate 1 side and the devices 3 is generated at the adherend surface at the time of stripping the devices 3 from the base substrate 1, so that it is difficult to strip the devices, possibly resulting in a bad transfer.

In contrast, in the present method of transferring the devices 3, not only the difference between the adhesive force between the second adhesive layer 6 before curing by the UV laser light 7 and the devices 3 and the adhesive force between the first adhesive layer 2 and the devices 3 is utilized for the transfer of the devices 3. Also, the devices 3 arranged and fixed on the base substrate 1 and made releasable from the base substrate 1 through plasticizing the first adhesive layer 2 with heat. By this, it is possible to obviate the above-mentioned problem that a force orthogonal to the adherend surface between the first adhesive layer 2 and the devices 3 would be generated at the adherend surface at the time of stripping the devices 3 from the first adhesive layer 2 which would make it difficult to strip the devices 3 and to transfer the devices 3 securely.

In addition, in the present method of transferring the devices 3, the mask 5 is used at the time of irradiating the first adhesive layer 2 with the UV laser light 7, so that the first adhesive layer 2 can be securely irradiated with the UV laser light 7 only at the desired positions, namely, only at the positions corresponding to the devices 3 to be transferred. Thus, the first adhesive layer 2 can be heated and plasticized only at the desired positions, namely, only at the positions corresponding to the devices 3 to be transferred. Therefore, in the present method of transferring the devices 3, only the adhesive force between the first adhesive layer 2 and the devices 3 to be transferred and lowered. As a result, only the desired devices 3 can selectively be made to be releasable from the base substrate 1, so that the selective transfer of the devices 3 is achieved.

In the case of performing spacing-wider-apart transfer of the devices by transferring a number of devices 3 at a time, for example, the device 3 is determined, and only this device is positioned at a predetermined position. By this, the other devices to be transferred are also positioned at predetermined positions at a stroke, so that the mounting positions of the individual devices are not staggered on a device basis, and transfer of the devices with high accuracy can be achieved.

At the time of irradiating the second adhesive layer 6 with the UV laser light 7, it is preferable to irradiate with the UV laser light 7 only at positions corresponding to the devices 3 transferred onto the transfer substrate 4, by use of a mask 5 or the like. By irradiating the second adhesive layer 6 with the UV laser light 7 only at the positions corresponding to the devices 3 transferred onto the transfer substrate 4, the second adhesive layer 6 is heated and melted only at the positions corresponding to the devices 3. In this case, since the second adhesive layer 6 at other positions than the positions for attaching the devices 3 is not softened and does not flow, transfer of the devices 3 can be performed with higher accuracy.

FIG. 2 shows a second embodiment of the method of the present invention. The same members as those used in the description of first embodiment are denoted by the same symbols as in the first embodiment, and detailed description thereof will be omitted.

To transfer devices 3, as shown in FIG. 2A, first, a first adhesive layer 2 is provided on a base substrate 1 as a supply source, and a number of devices 3 are arranged and formed thereon. Here, the case of forming the first adhesive layer 2 of a thermoplastic resin will be described.

In addition, as shown in FIG. 2A, a second adhesive layer 6 is provided on a major surface on the transfer surface side for the devices 3 of a transfer substrate 4, and the base substrate 1 and the transfer substrate 4 are disposed in a desired positional relationship, with the devices 3 and the second adhesive layer 6 opposed to and making contact with each other. Incidentally, the case of using a UV-curable resin as the material of the second adhesive layer 6 will be described below.

Figure 2B:
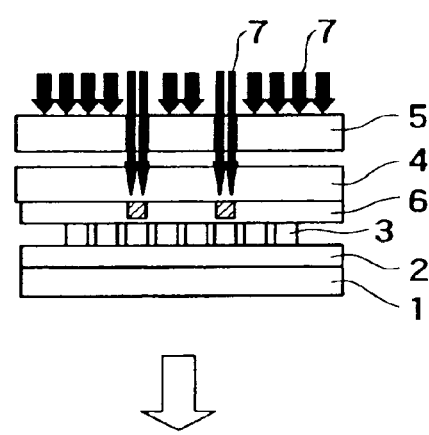

At the time of transfer, as shown in FIG. 2B, the second adhesive layer 6 is irradiated with UV laser light 7 from the back side of the transfer substrate 4, namely, from the major surface of the transfer substrate 4 on the side opposite to the side where the second adhesive layer 6 is provided. At this time, by using a mask 5, the second adhesive layer 6 is selectively irradiated with the UV laser light 7 only at positions corresponding to the devices 3 to be transferred. Here, the mask 5 is provided with laser light transmission holes for passing the laser light only at the positions corresponding to the devices 3 to be transferred, at predetermined intervals, and the UV laser light 7 radiated at other positions than the laser light transmission holes is shielded by the mask 5.

Thus, by irradiating with the UV laser light 7 and using the mask 5, the second adhesive layer 6 is cured only at the positions corresponding to the devices 3 to be transferred. At this time, since the second adhesive layer 6 is in contact with the devices 3, the devices 3 are fixed on the second adhesive layer 6 through the curing of the second adhesive layer 6.

Figure 2C:
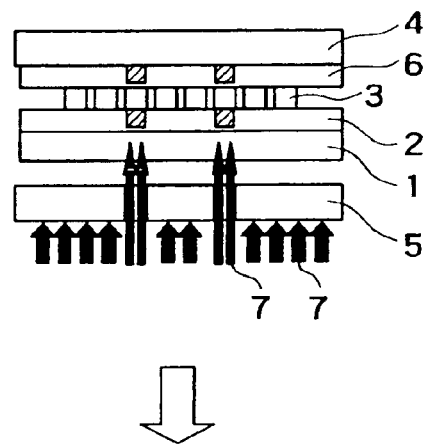

Next, as shown in FIG. 2C, the first adhesive layer 2 is irradiated with the UV laser light 7 from the back side of the base substrate 1, namely, from the major surface of the base substrate 1 on the side opposite to the side where the devices 3 are arranged and formed. At this time, by using the mask 5, the first adhesive layer 2 is selectively irradiated with the UV laser light 7 only at the positions corresponding to the devices 3 to be transferred. Here, the mask 5 is provided with laser light transmission holes for passing the laser light only at the positions corresponding to the devices 3 to be transferred, at predetermined intervals, and the UV laser light 7 at other positions than the laser light transmission holes is shielded by the mask 5.

Thus, by irradiating with the UV laser light 7 and using the mask 5, the first adhesive layer 2 is heated and plasticized by the UV laser light 7 only at the positions corresponding to the devices 3 to be transferred, whereby the adhesive force between the first adhesive layer 2 and the devices 3 to be transferred is lowered. By this, only the devices 3 to be transferred can be made to be releasable from the base substrate 1.

Figure 2D:
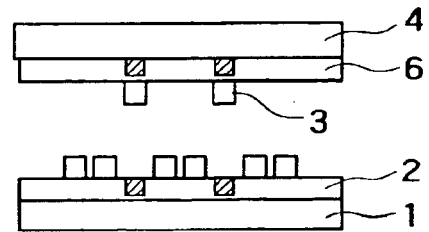

Then, the transfer substrate 4 is stripped from the base substrate 1, whereby the devices 3 are transferred from the base substrate 1 onto the transfer substrate 4. FIG. 2D shows the condition where the transfer substrate 4 has been stripped from the base substrate 1, in which the devices 3 have been transferred onto the second adhesive layer 6. By these operations, the devices 3 can selectively be transferred from the base substrate 1 onto the transfer substrate 4.

In the method of transferring the devices according to the present invention as described above, the second adhesive layer 6 is selectively irradiated with the UV laser light 7 only at the positions corresponding to the devices 3 to be transferred by use of the mask 5. By thus selectively irradiating with the UV laser light 7, the second adhesive layer 6 is cured only at the positions corresponding to the devices 3 to be transferred, whereby only the devices 3 to be transferred can be fixed on the second adhesive layer 6.

In the present method of transferring the devices, the first adhesive layer 2 is selectively irradiated with the UV laser light 7 only at the positions corresponding to the devices 3 to be transferred by use of the mask 5. By thus selectively irradiating with the UV laser light 7, the first adhesive layer 2 is heated and plasticized by the UV laser light 7 only at the positions corresponding to the devices 3 to be transferred, whereby the adhesive force between the first adhesive layer 2 and the devices 3 to be transferred can be lowered. As a result, only the devices 3 to be transferred can be made to be releasable from the base substrate 1, so that only the desired devices 3 are selectively transferred onto the transfer substrate 4.

Namely, in the present method of transferring the devices 3, only the devices 3 to be transferred are selectively made to be releasable, and, of the devices 3 arranged and fixed on the base substrate 1, only the devices 3 to be transferred are selectively fixed on the second adhesive layer 6. Therefore, in this method of transferring the devices 3, only the desired devices 3 are selectively transferred onto the transfer substrate 4, and therefore the transfer of the devices 3 is performed efficiently.

In the present method of transferring the devices 3, the difference between the tack between the second adhesive layer 2 before curing by the UV laser light 7 and the devices 3 and the adhesive force between the first adhesive layer 2 and the devices 3 is utilized for the transfer of the devices 3. Also, the devices 3 arranged and fixed on the base substrate 1 and preliminarily made to be releasable through plasticizing the first adhesive layer 2 by heating. By this, it is possible to obviate the problem that a force orthogonal to the adherend surface between the first adhesive layer 2 and the devices 3 would be generated at the time of releasing the devices 3 from the first adhesive layer 2 and it which makes difficult to release the devices 3. As a result, it is possible to transfer the devices 3 securely.

In addition, in the present method of transferring the devices 3, the mask 5 is used at the times of irradiating the first adhesive layer 2 and the second adhesive layer 6 with the UV laser light 7, so that the first adhesive layer 2 and the second adhesive layer 6 are securely irradiated with the UV laser light 7 only at the desired positions, namely, only at the positions corresponding to the devices 3 to be transferred. By this, the first adhesive layer 2 can be plasticized only at the desired positions, namely, only at the positions corresponding to the devices 3 to be transferred, and the second adhesive layer 6 can be cured only at the desired positions, namely, only at the positions corresponding to the devices 3 to be transferred, whereby only the devices 3 to be transferred can be fixed on the second adhesive layer 6.

In the present method of transferring the devices 3, therefore, only the adhesive force between the first adhesive layer 2 and the devices 3 to be transferred are lowered. As a result, only the desired devices 3 are selectively made to be releasable from the base substrate 1, and selective transfer of these devices 3 is achieved.

In the case of performing spacing-wider-apart transfer of the devices a number of the devices 3 are transferred at a time. For example, using device 3 as a reference of the devices to be transferred, device 3 and only this device is positioned at a predetermined position. By this, the other devices to be transferred are also positioned at predetermined positions at a stroke, so that the mounting positions of the individual devices are not staggered on a device basis, and transfer of the devices achieved with high accuracy.

FIG. 3 shows a third embodiment of the method of transferring devices according to the present invention. The same members as those used in the description of first embodiment are denoted by the same symbols as those used in first embodiment, and detailed description thereof will be omitted.

In order to transfer the devices 3, as shown in FIG. 3A, a first adhesive layer 2 is provided on a base substrate 1 to be a supply source, and a number of devices 3 are arranged and formed thereon. Here, the case of forming the first adhesive layer 2 of a thermoplastic resin will be described.

In addition, as shown in FIG. 3A, a second adhesive layer 6 is provided on a major surface of a transfer substrate 4 on the side to be a transfer surface for the devices 3, and the base substrate 1 and the transfer substrate 4 are disposed in a desired positional relationship, with the devices 3 and the second adhesive layer 6 opposed to and making contact with each other. Incidentally, the case of using a UV-curable resin as the material of the second adhesive layer 6 will be described below.

At the time of transfer, as shown in FIG. 3B, the devices 3 are irradiated with UV laser light 7 from the back side of the transfer substrate 4, namely, from the major surface of the transfer substrate 4 on the side opposite to the side where the second adhesive layer 6 is provided. At this time, only the devices 3 to be transferred are selectively irradiated with the UV laser light 7 by use of a mask 5. Here, the mask 5 is provided with laser light transmission hole for passing the laser light only at the positions corresponding to the devices 3 to be transferred, and the UV laser light 7 radiated at other positions than the laser light transmission holes is shielded by the mask 5.

When the devices 3 are heated by irradiating with the UV laser light 7 and by use of the mask 5, the heat is transmitted to the first adhesive layer 2, and the first adhesive layer 2 is plasticized only at the positions corresponding to the devices 3 to be transferred, so that the adhesive force between the first adhesive layer 2 and the devices 3 to be transferred is lowered. By this, only the devices 3 to be transferred can be made to be releasable from the base substrate 1.

Besides, when the devices 3 are irradiated with the UV laser light 7, the second adhesive layer 6 is irradiated with the UV laser light 7 at the positions corresponding to the devices 3, so that the second adhesive layer 6 is cured only at the positions corresponding to the devices 3 to be transferred. Since the second adhesive layer 6 is in contact with the devices 3, the devices 3 are fixed on the second adhesive layer 6 through curing of the second adhesive layer 6.

Then, the transfer substrate 4 is stripped from the base substrate 1, whereby the devices 3 are transferred from the base substrate 1 onto the transfer substrate 4. FIG. 3C shows the condition where the transfer substrate 4 has been stripped from the base substrate 1, in which the devices 3 have been transferred onto the second adhesive layer 6. By these operations, the devices 3 can selectively be transferred from the base substrate 1 onto the transfer substrate 4.

In the method of transferring devices according to the present invention as described above, the devices 3 to be transferred are heated by irradiation with the UV laser light 7 as described above. By thus heating the devices 3, the heat of the devices 3 is transmitted to the first adhesive layer 2, so that the first adhesive layer 2 can be heated indirectly. By this, the first adhesive layer 2 can be plasticized only at the positions corresponding to the devices 3 to be transferred, and the adhesive force between the first adhesive layer 2 and the devices 3 to be transferred can thereby be lowered, so that only the devices 3 to be transferred can selectively be made to be releasable from the base substrate 1.

In addition, by heating the devices 3 to be transferred through the selective irradiation with the UV laser light 7, the second adhesive layer 6 is also selectively irradiated with the UV laser light 7 at the positions corresponding to the devices 3, so that the second adhesive layer 6 is cured only at the positions corresponding to the devices 3 to be transferred, and only the devices 3 to be transferred can be fixed on the second adhesive layer 6. In the present method of transferring the devices, therefore, only the desired devices 3 can be selectively transferred onto the transfer substrate 4, whereby transfer of the devices 3 can be performed efficiently.

In the present method of transferring the devices 3, the difference between the tack between the second adhesive layer 6 before curing by the UV laser light 7 and the devices 3 and the adhesive force between the first adhesive layer 2 and the devices 3 is utilized for transfer of the devices 3. Also, the devices 3 arranged and fixed on the base substrate 1 and made to be releasable through plasticizing the first adhesive layer 2 by heating, whereby the devices 3 arranged and fixed on the base substrate 1 and preliminarily made to be releasable. Thus, it is possible to obviate the problem that a force orthogonal to the adherend surface between the first adhesive layer 2 and the devices 3 is generated at the time of releasing the devices 3 from the first adhesive layer 1 which would make it difficult to release the devices 3. As a result it is possible to transfer the devices 3 securely.

In the present method of transferring the devices 3, the mask 5 is used at the time of irradiation with the UV laser light 7, so that only the desired devices 3, namely, only the devices 3 to be transferred can securely be irradiated selectively with the UV laser light 7 and thereby heated. By this, the first adhesive layer 2 is plasticized through the indirect heating only at the desired positions, namely, only at the positions corresponding to the devices 3 to be transferred, whereby only the adhesive force between the first adhesive layer 2 and the devices 3 to be transferred are lowered assuredly. In addition, the second adhesive layer 6 can be irradiated with the UV laser light 7 and thereby cured only at the desired positions, namely, only at the positions corresponding to the devices 3 to be transferred, whereby only the devices 3 to be transferred are assuredly fixed on the second adhesive layer 6. As a result, only the devices 3 to be transferred are securely transferred.

In the case of performing spacing-wider-apart transfer of the devices a number of the devices are transferred at a time. For example, using device 3 as a reference of the devices to be transferred, only this device is positioned at a predetermined position. By this, the other devices to be transferred are also positioned at predetermined positions at a stroke, so that the mounting positions of the individual devices are not staggered on a device basis, and transfer of the devices is achieved with high accuracy.

FIG. 4 shows a fourth embodiment of the method of transferring devices according to the present invention. The same members as those used in the description of first embodiment are denoted by the same symbols as used in first embodiment, and detailed description thereof will be omitted.

Figure 4A:
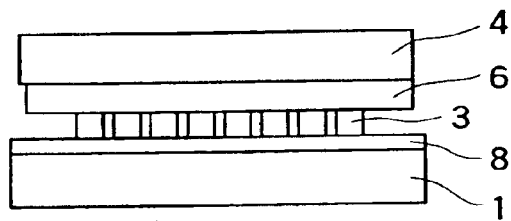
FIGS. 4A to 4C are sectional views illustrating an example of a transfer process according to another embodiment of the present invention.

To transfer devices 3, as shown in FIG. 4A, first, a release layer 8 is provided on a base substrate 1 to be a supply source, and a number of devices 3 are arranged and formed thereon. The release layer 8 can be formed by using, for example, a fluoro coat, a silicone resin, a water-soluble adhesive (for example, PVA), a polyimide or the like. Here, the case of forming the release layer 8 of a polyimide and using a quartz substrate as the base substrate 1 will be described.

In addition, as shown in FIG. 4A, a second adhesive layer 6 is provided on a major surface of a transfer substrate 4 on the side to be a transfer surface for the devices 3, and the base substrate 1 and the transfer substrate 4 are disposed in a desired positional relationship, with the devices 3 and the second adhesive layer 6 opposed to and making contact with each other. Incidentally, the case of using a pressure sensitive adhesive material as the second adhesive layer 6 will be described below.

Figure 4B:
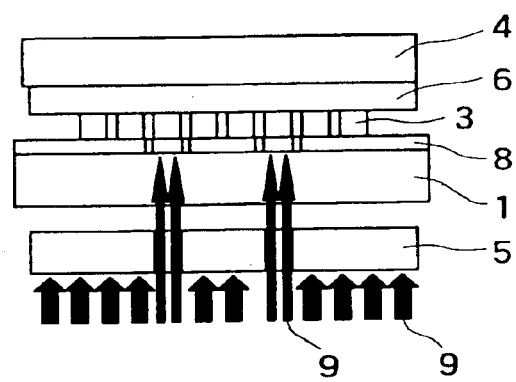

Next, as shown in FIG. 4B, the release layer 8 is irradiated with excimer laser light 9 from the back side of the base substrate 1, namely, from the major surface on the side opposite to the side where the devices 3 are arranged and fixed. At this time, irradiation with the excimer laser light 9 is conducted only at the positions corresponding to the devices 3 to be transferred, by use of a mask 5. Here, the mask 5 is provided with laser light transmission holes for passing the laser light only at the positions corresponding to the devices 3 to be transferred, at predetermined intervals, and the excimer laser light 9 radiated at other positions than the laser light transmission holes is shielded.

By thus irradiating with the excimer laser light 9 by use of the mask 5, exfoliation is caused by ablation of the polyimide at the interface between the release layer 8 and the base substrate 1, namely, at the interface between the polyimide and the quartz substrate, at the positions corresponding to the devices 3 to be transferred, resulting in these devices 3 being released together with the release layer 8. By this, only the devices 3 to be transferred are made to be releasable from the base substrate 1.

Figure 4C:
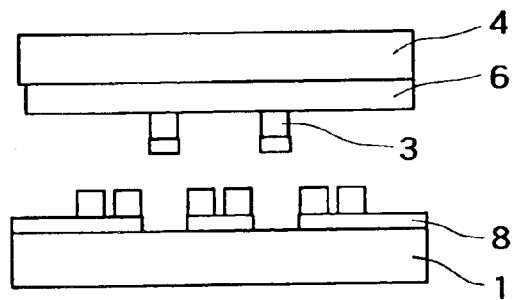

At this time, the devices 3 are fixed on the second adhesive layer 6 by the tack of the pressure sensitive adhesive material constituting the second adhesive layer 6. Therefore, by stripping the transfer substrate 4 from the base substrate 1, the devices 3 are transferred from the base substrate 1 onto the transfer substrate 4. FIG. 4C shows the condition where the transfer substrate 4 has been stripped from the base substrate 1, in which the devices 3 have been transferred onto the second adhesive layer 6. By these operations, the devices 3 can selectively be transferred from the base substrate 1 onto the transfer substrate 4.

In the method of transferring devices according to the present invention as described above, the release layer 8 is selectively irradiated with the excimer laser light 9 only at the positions corresponding to the devices 3 to be transferred, by use of the mask 5. By such selective irradiation with the excimer laser light 9, exfoliation is caused by ablation of the polyimide at the interface between the release layer 8 and the base substrate 1, namely, at the interface between the polyimide and the quartz substrate only at the devices 3 to be transferred and the positions corresponding to these devices 3, resulting in the release of these devices 3. Thus, only the devices 3 to be transferred are made to be releasable from the base substrate 1, so that only the desired devices 3 are transferred onto the transfer substrate 4.

In the present method of transferring the devices 3, the devices 3 arranged and fixed on the base substrate 1 and are selectively made to be releasable, whereby only the desired devices 3 are selectively transferred onto the transfer substrate 4, and transfer of the devices 3 is thereby performed efficiently.

In addition, in the present method of transferring the devices 3, the devices 3 arranged and fixed on the base substrate 1 and are preliminarily made to be releasable. By this, it is possible to obviate the problem that a force orthogonal to the adherend surface between the base substrate 1 and the devices 3 is generated at the time of releasing the devices 3 from the base substrate 1 and therefore, making it difficult to release the devices 3. As a result, it is possible to transfer the devices 3 securely.

In the present method of transferring the devices 3, the mask 5 is used at the time of irradiating the release layer 8 with the excimer laser light 9, so that the release layer 8 is securely irradiated with the excimer laser light 9 only at the desired positions, namely, only at the positions corresponding to the devices 3 to be transferred. Thus, exfoliation of the release layer 8 due to ablation can be caused only at the desired positions, namely, only at the positions corresponding to the devices 3 to be transferred. In this method of transferring the devices 3, therefore, the release layer 8 can be made to be releasable only at the positions corresponding to the devices 3 to be transferred. As a result, only the desired devices 3 are selectively made to be releasable from the base substrate 1 together with the release layer 8, so that selective transfer of the devices 3 is achieved.

In the case of performing spacing-wider-apart transfer of the devices a number of the devices 3 are transferred at a time. For example, using device 3 as a reference of one of the devices to be transferred, only this device is positioned at a predetermined position. By this, the other devices to be transferred are also positioned at predetermined positions at a stroke, so that the mounting positions of the individual devices are not staggered on a device basis, and transfer of the devices is achieved with high accuracy.

While the case of irradiating the release layer 8 with the excimer laser light 9 has been described above, this is not limited to such a method, and the laser light may be appropriately selected in consideration of the combination of the materials constituting the release layer 8 and the base substrate 1 and the like. For example, YAG-UV laser light or the like can also be used.

FIG. 5 shows a fifth embodiment of the method of transferring devices according to the present invention. The same members as those used in the description of first embodiment are denoted by the same symbols as used in first embodiment, and detailed description thereof will be omitted.

To transfer devices 3, as shown in FIG. 5A, a first adhesive layer 2 is provided on a base substrate 1 to be a supply source, and a number of the devices 3 are arranged and formed thereon. Here, the first adhesive layer 2 has a structure in which a UV-curable type pressure sensitive adhesive layer 81 formed of a UV-curable type pressure sensitive adhesive material is provided on the base substrate 1, and a release layer 8 is provided on the UV-curable type pressure sensitive adhesive layer 81. The release layer 8 is formed by using, for example, a fluoro coat, a silicone resin, a water-soluble adhesive (for example, PVA), a polyimide or the like. Here, the case of forming the release layer 8 of a polyimide will be described. At this stage, the release layer 8 is separated on a device 3 basis.

In addition, as shown in FIG. 5A, a second adhesive layer 6 is provided on a major surface of a transfer substrate 4 on the side to be a transfer surface for the devices 3, and the base substrate 1 and the transfer substrate 4 are disposed in a desired positional relationship, with the devices 3 and the second adhesive layer 6 are opposed to and making contact with each other. Incidentally, the case of using a pressure sensitive adhesive material as the second adhesive layer 6 will be described below.

At the time of transfer, first, as shown in FIG. 5B, the entire area of the UV-curable type pressure sensitive adhesive layer 81 of the first adhesive layer is irradiated with UV laser light 7 from the back side of the base substrate 1, namely, from the major surface of the base substrate 1 on the side opposite to the side where the devices 3 are arranged and formed, whereby the UV-curable type pressure sensitive adhesive layer 81 is cured.

Next, as shown in FIG. 5C, the release layer 8 of the first adhesive layer 2 is irradiated with excimer laser light 9 from the back side of the base substrate 1, namely, from the major surface of the base substrate 1 on the side opposite to the side where the devices 3 are arranged and formed. At this time, the release layer 8 is selectively irradiated with the excimer laser light 9 only at the positions corresponding to the devices 3 to be transferred, by use of a mask 5. Here, the mask 5 is provided with laser light transmission holes for passing the laser light only at the positions corresponding to the devices 3 to be transferred, at predetermined intervals, and the excimer laser light 9 radiated at other positions than the laser light transmission holes is shielded by the mask 5.

By thus irradiating with the excimer laser light 9 by use of the mask 5, exfoliation due to ablation of the release layer 8, namely, the polyimide is generated at the interface between the release layer 8 and the cured UV-curable type pressure sensitive adhesive layer 81 at the positions corresponding to the devices 3 to be transferred, resulting in that these devices 3 can be released together with the release layer 8. Thus, only the devices 3 to be transferred are made to be releasable from the base substrate 1.

In addition, at this time, the devices 3 are fixed on the second adhesive layer 2 by the tack of the pressure sensitive adhesive material constituting the second adhesive layer 6. Therefore, by stripping the transfer substrate 4 from the base substrate 1, the devices 3 are transferred from the base substrate 1 onto the transfer substrate 4. FIG. 5D shows the condition where the transfer substrate 4 has been stripped from the base substrate 1, in which the devices 3 have been transferred onto the second adhesive layer 6. By these operations, the devices 3 can selectively be transferred from the base substrate 1 onto the transfer substrate 4.

In the method of transferring devices according to the present invention as described above, the release layer 8 is selectively irradiated with the excimer layer light 9 only at the positions corresponding to the devices 3 to be transferred, by use of the mask 5. Thus, by the selective irradiation with the excimer laser light 9, exfoliation due to ablation of the polyimide is generated at the interface between the release layer 8 and the cured UV-curable type pressure sensitive adhesive layer 81, only at the devices 3 to be transferred and the positions corresponding to these devices, resulting in these devices 3 being released. Thus, only the devices 3 to be transferred are made to be releasable from the UV-curable type pressure sensitive adhesive layer 81, and only the desired devices 3 can selectively be transferred onto the transfer substrate 4.

In the present method of transferring the devices 3, the devices 3 arranged and fixed on the base substrate 1 are selectively made to be releasable and are transferred whereby only the desired devices 3 can be selectively transferred onto the transfer substrate 4. As a result, the transfer of the devices 3 is performed efficiently.

In the present method of transferring the devices 3, the devices 3 arranged and fixed on the base substrate 1 are preliminarily made to be releasable. Thus, it is possible to obviate the problem that a force orthogonal to the adherend surface between the base substrate 1 and the devices 3 is generated at the time of releasing the devices 3 from the base substrate 1 which would make it difficult to release the devices 3. Thus, it is possible to transfer the devices 3 securely.

In addition, in the present method of transferring the devices 3, the mask 5 is used at the time of irradiating the release layer 8 with the excimer laser light 9, so that the release layer 8 is securely irradiated with the excimer laser light 9 only at the desired positions, namely, only at the positions corresponding to the devices 3 to be transferred. By this, exfoliation of the release layer 8 due to ablation can be caused only at the positions corresponding to the devices 3 to be transferred. In this method of transferring the devices 3, therefore, the release layer 8 is made to be releasable only at the positions corresponding to the devices 3 to be transferred. As a result, only the desired devices 3 are selectively made to be releasable from the base substrate 1 together with the release layer 8, so that selective transfer of these devices 3 is achieved.

In the case of performing spacing-wider-apart transfer of the devices a number of the devices 3 are transferred at a time. For example, using device 3 as a reference of the devices to be transferred, only this device is positioned at a predetermined position. By this, the other devices to be transferred are also positioned at predetermined positions at a stroke, so that the mounting positions of the individual devices are not staggered on a device basis, and transfer of the devices can be performed with high accuracy.

While the case of irradiating the first adhesive layer 2 with the excimer laser light 9 has been described above, this is not a limitation, and laser light may be appropriately selected in consideration of the combination of the materials constituting the first adhesive layer 2 and the base substrate 1 and the like. For example, YGA-UV laser light or the like can also be used.

FIG. 6 shows a sixth embodiment of the method of transferring devices according to the present invention. The same members as those used in the description of first embodiment are denoted by the same symbols as used in first embodiment, and detailed description thereof will be omitted.

To transfer the devices 3, as shown in FIG. 6A, a release layer 8 is provided on a base substrate 1 to be a supply source, and a number of the devices 3 are arranged and formed thereon. The release layer 8 is formed by using, for example, a fluoro coat, a silicone resin, a water-soluble adhesive (for example, PVA), a polyimide or the like. Here, the case of forming the release layer 8 of a polyimide and using a quartz substrate as the base substrate 1 will be described.

In addition, as shown in FIG. 6A, a second adhesive layer 6 is provided on a major surface of a transfer substrate 4 on the side to be a transfer surface for the devices 3, and the base substrate 1 and the transfer substrate 4 are disposed in a desired positional relationship, with the devices 3 and the second adhesive layer 6 opposed to and making contact with each other. Incidentally, the case of using a UV-curable resin as the second adhesive layer 6 will be described.

At the time of transfer, as shown in FIG. 6B, the second adhesive layer 6 is irradiated with UV laser light 7 from the back side of the transfer substrate 4, namely, from the major surface of the transfer substrate 4 on the side opposite to the side where the second adhesive layer 6 is provided. At this time, the second adhesive layer 6 is selectively irradiated with the UV laser light 7 only at the positions corresponding to the devices 3 to be transferred, by use of a mask 5.

Here, the mask 5 is provided with laser light transmission holes for passing the laser light only at the positions corresponding to the devices 3 to be transferred, at predetermined intervals, and the UV laser light 5 radiated at other positions than the laser light transmission holes is shielded by the mask 5. By thus irradiating with the UV laser light 7 by use of the mask 5, the second adhesive layer 6 is cured only at the positions corresponding to the devices 3 to be transferred. At this time, since the second adhesive layer 6 is in contact with the devices 3, the devices 3 are fixed on the second adhesive layer 6 by the curing of the second adhesive layer 2.

Next, as shown in FIG. 6C, the release layer 8 is irradiated with excimer laser light 9 from the back side of the base substrate 1, namely, from the major surface of the base substrate 1 on the side opposite to the side where the devices 3 are arranged and formed. At this time, the release layer 8 is selectively irradiated with the excimer laser light 9 only at the positions corresponding to the devices 3 to be transferred, by use of a mask 5. Here, the mask 5 is provided with laser light transmission holes for passing the laser light only at the positions corresponding to the devices 3 to be transferred, at predetermined intervals, and the excimer laser light 9 radiated at other positions than the laser light transmission holes is shielded by the mask 5.

By thus irradiating with the excimer layer light 9 by use of the mask 5, exfoliation due to ablation of the release layer 8, namely, the polyimide is generated at the interface between the release layer 8 and the base substrate 1 at the positions corresponding to the devices 3 to be transferred, resulting in these devices 3 being released together with the release layer 8. Thus, only the devices 3 to be transferred can be made to be releasable from the base substrate 1.

Then, the transfer substrate 4 is stripped from the base substrate 1, whereby the devices 3 are transferred from the base substrate 1 onto the transfer substrate 4. FIG. 6D shows the condition where the transfer substrate 4 has been stripped from the base substrate 1, in which the devices 3 have been transferred onto the second adhesive layer 6. By these operations, the devices 3 can selectively be transferred from the base substrate 1 onto the transfer substrate 4.

In the method of transferring devices according to the present invention as described above, the release layer 8 is selectively irradiated with the excimer laser light 9 only at the positions corresponding to the devices 3 to be transferred, by use of the mask 5. Thus, by the selective irradiation with the excimer laser light 9, exfoliation due to ablation of the polyimide is caused at the interface between the release layer 8 and the base substrate 1 only at the positions corresponding to the devices 3 to be transferred, so that these devices 3 are released. By this, only the devices 3 to be transferred are made to be releasable from the base substrate 1, and only the desired devices 3 are selectively transferred onto the transfer substrate 4.

In the present method of transferring the devices 3, therefore, the devices 3 arranged and fixed on the base substrate 1 are selectively made to be releasable, whereby only the desired devices 3 can be selectively transferred onto the transfer substrate 4, and transfer of the devices 3 is performed efficiently.

In the present method of transferring the devices 3, the devices 3 arranged and fixed on the base substrate 1 are preliminarily made to be releasable. By this, it is possible to obviate the problem that a force orthogonal to the adherend surface between the base substrate 1 and the devices 3 are generated at the time of releasing the devices 3 from the base substrate 1 and thereby making it difficult to release the devices 3. As a result, it is possible to transfer the devices 3 securely.

In the present method of transferring the devices 3, the mask 5 is used at the time of irradiating the release layer 8 with the excimer laser light 9, so that the release layer 8 can be securely irradiated with the excimer laser light 9 only at the desired positions, namely, only at the positions corresponding to the devices 3 to be transferred. By this, exfoliation due to ablation of the release layer 8 can be generated only at the desired positions, namely, only at the positions corresponding to the devices 3 to be transferred. In this method of transferring the devices 3, therefore, the release layer 8 is made to be releasable only at the positions corresponding to the devices 3 to be transferred. As a result, only the desired devices 3 can selectively be made to be releasable from the base substrate 1 together with the release layer 8, so that selective transfer of these devices 3 is achieved.

In the case of performing spacing-wider-apart transfer of the devices, a number of the devices 3 are transferred at a time. For example, using device 3 as a reference of the devices 3 to be transferred, and this device is positioned at a predetermined position. By this, the other devices to be transferred are also positioned at predetermined positions at a stroke, so that the mounting positions of the individual devices are not staggered on a device basis, and transfer of the devices can be achieved with high accuracy.

While the case of irradiating the release layer 8 with the excimer laser light 9 has been described above, it is not limited, and laser light may be appropriately selected in consideration of the combination of the materials constituting the release layer 8 and the base substrate 1 and the like. For example, YAG-UV laser light or the like can also be used.

In a seventh embodiment, the case of transferring GaN-based light-emitting devices arranged and formed on a base substrate 1 onto a transfer substrate 4 according to the present invention will be described. FIG. 7 shows the seventh embodiment of the method of transferring devices according to the present invention. The same members as those used in the description of first embodiment are denoted by the same symbols as in first embodiment, and detailed description thereof will be omitted.

Figure 8A:
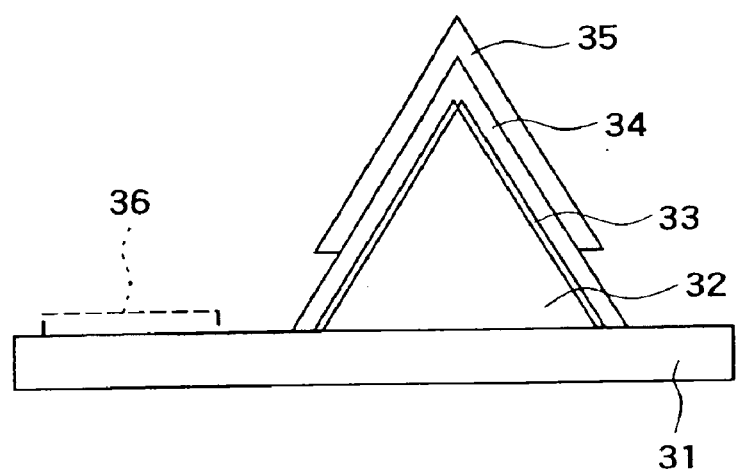
FIGS. 8A to 8B show an example of a light-emitting device, in which 8A is a sectional view, and 8B is a plan view.
Figure 8B:
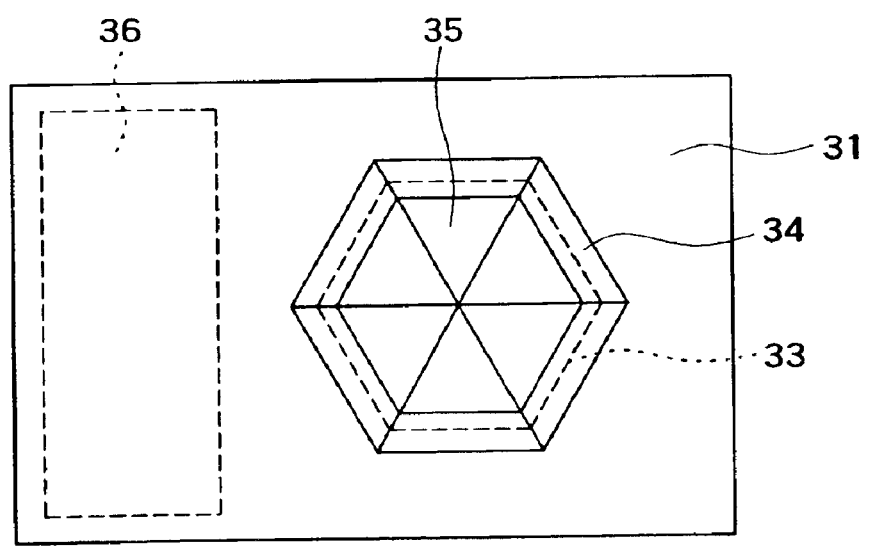

To transfer the light-emitting devices 21, as shown in FIG. 7A, a number of the light-emitting devices 21 are arranged and formed on the base substrate 1 to be a supply source. Here, the base substrate 1 is a sapphire substrate, and the light-emitting devices 21 are so-called pyramid-type light-emitting devices. FIG. 8 shows the structure of the light-emitting device 21. FIG. 8A is a sectional view of the device, and FIG. 8B is a plan view of the same. The light-emitting devices 21 are GaN-based light-emitting diodes, which are formed by crystal growth on the sapphire substrate. Such a GaN-based light-emitting diode is characterized in that laser ablation is generated by irradiation with laser light transmitting through the substrate, and exfoliation is generated at the interface between the sapphire substrate and the GaN-based growth layer attendant on the phenomenon of evaporation of nitrogen of GaN, thereby facilitating the separation of the device.

First, as to the structure, a hexagonal pyramid shaped GaN layer 3 is formed by selective growth on a substrate growth layer 31 consisting of a GaN-based semiconductor layer. An insulation film (not shown) is present on the substrate growth layer 31, and the hexagonal pyramid shaped GaN layer 32 is formed at an opened portion of the insulation film by an MOCVD method or the like. The GaN layer 32 is a pyramid shaped growth layer covered with S planes (1–101 planes) where the major surface of the sapphire substrate used at the time of growth is a C plane, and is a silicon-doped region. The portions of the inclined S planes of the GaN layer 32 function as a clad having a double hetero structure. An InGaN layer 33 as an active layer is formed so as to cover the inclined S planes of the GaN layer 32, and a magnesium-doped GaN layer 34 is formed on the outside thereof. The magnesium-doped GaN layer 34 also functions as a clad.

Such a light-emitting diode is provided with a p electrode 35 and an n electrode 36. The p electrode 35 is formed by vapor deposition of a metallic material such as Ni/Pt/Au or Ni(Pd)/Pt/Au on the magnesium-doped GaN layer 34. The n electrode 36 is formed by vapor deposition of a metallic material such as Ti/Al/Pt/Au at the opened portion of the insulation film (not shown).

The GaN-based light-emitting diode having such a structure is a device capable of emitting blue light also, and, particularly, capable of being released from the sapphire substrate comparatively easily through laser ablation, so that selective release is realized by selective irradiation with laser light. The GaN-based light-emitting diode may have a structure in which an active layer is flat plate-shaped or belt-shaped, and may have a pyramid structure in which a C plane is formed at the top end portion. Further, other nitride-based light-emitting devices and compound semiconductor devices may also be used.

As shown in FIG. 7A, a second adhesive layer 6 is provided on a major surface of the transfer substrate 4 on the side to be a transfer surface for the light-emitting devices 21, and the base substrate 1 and the transfer substrate 4 are disposed in a desired positional relationship, with the light-emitting devices 21 and the second adhesive layer 6 opposed to and making contact with each other. Here, the major surface of the second adhesive layer 6 on the side of the transfer surface for the light-emitting devices 21 is provided with recessed portions corresponding to the so-called pyramid type shape of the light-emitting devices 21, and the light-emitting devices 21 are fitted into the recessed portions at the time of transfer. The case of using a thermoplastic resin as the second adhesive layer 6 will be described below.

At the time of transfer, as shown in FIG. 7B, only the light-emitting devices 21 to be transferred are irradiated with UV laser light 7 from the back side of the base substrate 1, namely, from the major surface of the base substrate 1 on the side opposite to the side where the light-emitting devices 2 are arranged and formed. By this, release of the light-emitting devices 21 is generated due to ablation at the interface between the light-emitting devices 21 and the base substrate 1, making the light-emitting devices 21 releasable.

Simultaneously with the irradiation of the light-emitting devices 21 with the UV laser light 7, the second adhesive layer 6 only at the positions corresponding to the light-emitting devices 21 to be transferred are irradiated with infrared rays 83 from the back side of the transfer substrate 4, namely, from the major surface of the transfer substrate 4 on the side opposite to the side where the second adhesive layer 6 is provided, whereby the second adhesive layer 6 at those positions is heated and melted. Then, the irradiation with the infrared rays 83 is stopped, whereby the second adhesive layer 6 is cooled naturally and cured. At this time, the light-emitting devices 21 are in the state of being fitted in the recessed portions 82 of the second adhesive layer 6. Therefore, as the second adhesive layer 6 is melted and cured again, the light-emitting devices 21 are fixed to the second adhesive layer 6 in the state of being fitted in the recessed portions 82 of the second adhesive layer 6.

Then, the transfer substrate 4 is stripped from the base substrate 1, whereby the light-emitting devices 21 are transferred from the base substrate 1 onto the transfer substrate 4. FIG. 7C shows the condition where the transfer substrate 4 has been stripped from the base substrate 1, in which the light-emitting devices 21 have been transferred onto the second adhesive layer 6. By these operations, the light-emitting devices 21 are selectively transferred from the base substrate 1 onto the transfer substrate 4.

In the method of transferring the light-emitting devices 21 according to the present invention as described above, the irradiation with the UV laser light 7 is selectively conducted only at the positions corresponding to the light-emitting devices 21 to be transferred. Thus, selectively irradiating with the UV laser light 7, releases the light-emitting devices 21 due to ablation only at the interface between the light-emitting devices 21 to be transferred and the base substrate 1, whereby these light-emitting devices 21 are made to be releasable. Thus, only the light-emitting devices 21 to be transferred are selectively made to be releasable from the base substrate 1, and only the desired light-emitting devices 21 are selectively transferred onto the transfer substrate 4.

In the present method of transferring the light-emitting devices 21, therefore, the light-emitting devices 21 arranged on the base substrate 1 are selectively made to be releasable, whereby only the desired light-emitting devices 21 can be selectively transferred onto the transfer substrate 4, and transfer of the light-emitting devices 21 is performed efficiently.

In addition, in the present method of transferring the light-emitting devices 21, the light-emitting devices 21 arranged and fixed on the base substrate 1 are preliminarily made to be releasable. By this, it is possible to obviate the problem that a force orthogonal to the adherend surface between the base substrate 1 and the light-emitting devices 21 is generated at the time of releasing the light-emitting devices 21 from the base substrate 1 and making it difficult to release the light-emitting devices 21. Thus, it is possible to transfer the light-emitting devices 21 securely.

At the time of irradiating the light-emitting devices 21 with the UV laser light 7, a mask 5 may be used in the same manner as in first embodiment. By using the mask 5, only the light-emitting devices 21 to be transferred can be irradiated with the UV laser light 7 more securely, so that selective transfer of the light-emitting devices 21 is performed more securely.

At the time of irradiating the second adhesive layer 6 with the infrared rays 83, a mask 5 may be used in the same manner as in first embodiment and the like. By using the mask 5, irradiation with the infrared rays 83 is achieved only at the positions corresponding to the light-emitting devices 21 to be transferred, so that selective transfer of the light-emitting devices 21 is performed more securely.

In the case of transferring a number of the light-emitting devices 21 at a time, for example, a light-emitting device 21 of the devices to be transferred, is determined, and only this device is positioned at a predetermined position, whereby the other devices to be transferred are also positioned at predetermined positions at a stroke, so that the mounting positions of the individual devices are not staggered on a device basis, and transfer of the devices can be achieved with high accuracy.

While the case of irradiating with the UV laser light 7 from the back side of the base substrate 1 and irradiating with the infrared rays 83 from the back side of the transfer substrate 4 has been described above, the direction of irradiation with the infrared rays 83 is not limited to the above, and the light-emitting devices 21 may be irradiated with the infrared rays 83 from the back side of the base substrate 1. Namely, as shown in FIG. 7D, the light-emitting devices 21 to be transferred are irradiated with the UV laser light 7 and irradiated with the infrared rays 83. In this case, release of the light-emitting devices 21 is generated due to ablation at the interface between the light-emitting devices 21 and the base substrate 1, so that the light-emitting devices 21 are releasable.

In addition, by irradiating the light-emitting devices 21 with the infrared rays 83, the light-emitting devices 21 are heated. The heat of the light-emitting devices 21 is transmitted to the second adhesive layer 6, whereby the second adhesive layer 6 is heated and melted. Then, the irradiation of the light-emitting devices 21 with the infrared rays 83 is stopped, whereby the light-emitting devices 21 are cooled naturally, so that the conduction of heat to the second adhesive layer 6 is eliminated, and the second adhesive layer 6 is also cooled naturally and cured. At this time, the light-emitting devices 21 are in the state of being fitted in the recessed portions 82 of the second adhesive layer 6. Therefore, as the second adhesive layer 6 is melted and cured again, the light-emitting devices 21 are fixed to the second adhesive layer 6 in the state of being fitted in the recessed portions 82 of the second adhesive layer 6.

Then, as shown in FIG. 7C, the transfer substrate 4 is stripped from the base substrate 1, whereby the light-emitting devices 21 are transferred from the base substrate 1 onto the transfer substrate 4. By these operations, the light-emitting devices 21 can selectively be transferred from the base substrate 1 onto the transfer substrate 4.

Therefore, even in the case of irradiating the light-emitting devices 21 with both the UV laser light 7 and the infrared rays 83 from the back side of the base substrate 1, the light-emitting devices 21 can be selectively transferred from the base substrate 1 onto the transfer substrate 4 in the same manner as described above.

In an eighth embodiment, another example of transferring GaN-based light-emitting devices arranged and formed on a base substrate 1 onto a transfer substrate 4 according to the present invention will be described. FIG. 9 shows the eighth embodiment of the method of transferring devices according to the present invention. The same members as those used in the description of the first embodiment are denoted by the same symbols as used in the first embodiment, and detailed description thereof will be omitted.

Figure 9A:
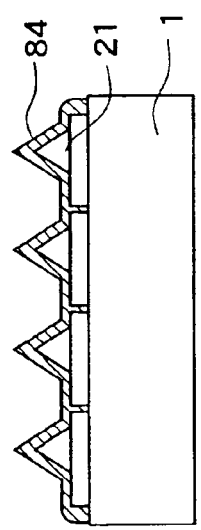
FIGS. 9A to 9D are sectional views illustrating an example of a transfer process according to one embodiment of the present invention.

To transfer the light-emitting devices 21, as shown in FIG. 9A, first, a number of the light-emitting devices 21 are arranged and formed on the base substrate 1 to be a supply source. Here, the base substrate 1 is a sapphire substrate, and the light-emitting devices 21 are the so-called pyramid-type light-emitting devices described in the seventh embodiment. Then, as shown in FIG. 9A, a mold release agent 84 is applied to the entire surface on the light-emitting devices 21.

Figure 9B:
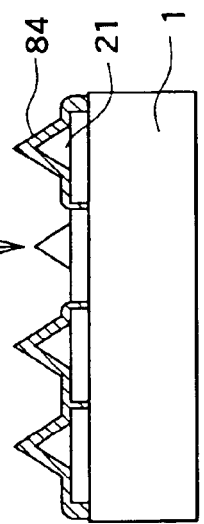
Figure 9C:
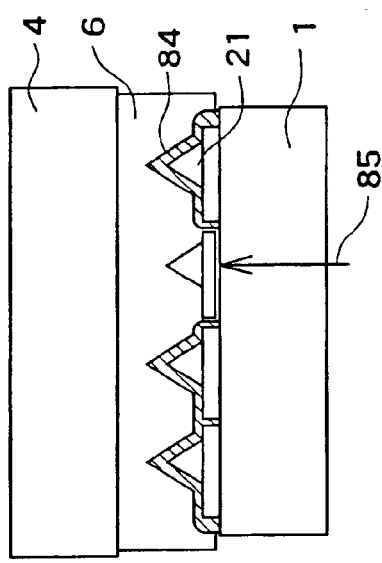

Next, as shown in FIG. 9B, only the mold release agent 84 on the light-emitting devices 21 to be transferred is irradiated with laser light 85, to remove the mold release agent 84 through laser ablation. As shown in FIG. 9C, a second adhesive layer 6 consisting of an adhesive is provided on a major surface of the transfer substrate 4 on the side to be a transfer surface for the light-emitting devices 21, and the base substrate 1 and the transfer substrate 4 are disposed in a desired positional relationship, with the light-emitting devices 21 and the second adhesive layer 6 opposed to and making contact with each other. Here, the major surface of the second adhesive layer 6 on the side of the transfer surface for the light-emitting devices 21 is provided with recessed portions corresponding to the so-called pyramid-type shape of the light-emitting devices 21 in the same manner as in seventh embodiment, and the light-emitting devices 21 are fitted in the recessed portions at the time of transfer.

Then, as shown in FIG. 9C, only the light-emitting devices 21 to be transferred are irradiated with laser light 85 from the back side of the base substrate 1, namely, from the major surface of the base substrate 1 on the side opposite to the side where the light-emitting devices 21 are arranged and formed. By this, release of the light-emitting devices 21 are generated due to ablation at the interface between the light-emitting devices 21 and the base substrate 1, making the light-emitting devices 21 releasable.

Then, the transfer substrate 4 is stripped from the base substrate 1. Here, the light-emitting devices 21 are fitted in the recessed portions of the second adhesive layer 6. Since the light-emitting devices 21 to be transferred are preliminarily deprived of the mold release agent 84, the devices are in direct contact with the second adhesive layer 6, are adhered and fixed to the second adhesive layer 6, and are transferred from the base substrate 1 onto the transfer substrate 4. On the other hand, the light-emitting devices 21 which are not being transferred are in indirect contact with the second adhesive layer 6 with the mold release agent 84 therebetween. When the transfer substrate 4 is stripped from the base substrate 1, therefore, the light-emitting devices 21 not being transferred are prevented from being transferred onto the transfer substrate 4 by the effect of the mold release agent, and are released from the second adhesive layer 6, so that they remain in the state of being fixed on the base substrate 1.

Figure 9D:
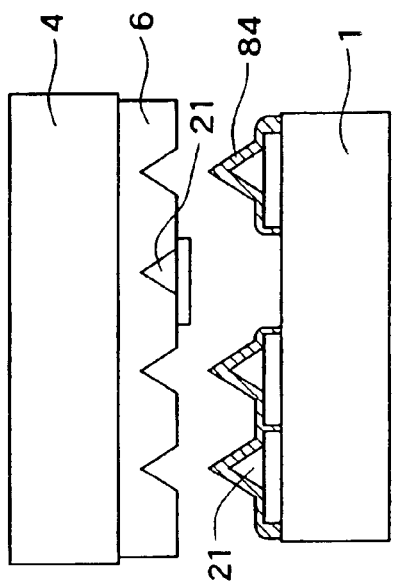

FIG. 9D shows the condition where the transfer substrate 4 has been stripped from the base substrate 1, in which the light-emitting devices 21 to be transferred have been transferred onto the second adhesive layer 6. By these operations, the light-emitting devices 21 are selectively transferred from the base substrate 1 onto the transfer substrate 4.

In the method of transferring the light-emitting devices 21 according to the present invention as described above, irradiation with the laser light 85 is conducted selectively only at the positions corresponding to the light-emitting devices 21 to be transferred. Thus, by selectively irradiating with the laser light 85, the light-emitting devices 21 are released due to ablation only at the interface between the light-emitting devices 21 to be transferred and the base substrate 1, making these light-emitting devices 21 releasable. By this, only the light-emitting devices 21 to be transferred are made to be releasable from the base substrate 1, resulting in only the desired light-emitting devices 21 being selectively transferred onto the transfer substrate 4.

In the present method of transferring the light-emitting devices 21, therefore, the light-emitting devices 21 arranged on the base substrate 1 are selectively made to be releasable, whereby only the desired light-emitting devices 21 can be selectively transferred onto the transfer substrate 4, and transfer of the light-emitting devices 21 is performed efficiently.

In addition, in the method of transferring the light-emitting devices 21, the light-emitting devices 21 arranged and fixed on the base substrate 1 are preliminarily made to be releasable. By this, it is possible to obviate the problem that a force orthogonal to the adherend surface between the base substrate 1 and the light-emitting devices 21 would be generated at the time of releasing the light-emitting devices 21 from the base substrate 1 and it would be difficult to release the light-emitting devices 21, and it is possible to transfer the light-emitting devices 21 securely.

At the time of irradiating the light-emitting devices 21 with the laser light 85, a mask 5 may be used in the same manner as in the first embodiment and the like. By using the mask 5, only the light-emitting devices 21 to be transferred are irradiated with the laser light 85 more securely, and selective transfer of these light-emitting devices 21 can be achieved more assuredly.

In the case of performing spacing-wider-apart transfer of the devices a number of the light-emitting devices 21 are transferred at a time. For example, a light-emitting device 21 of the light-emitting devices 21 to be transferred is determined. Only this light-emitting device is positioned at a predetermined position. By this, the other light-emitting devices 21 to be transferred are also positioned at predetermined positions at a stroke, so that the mounting positions of the individual devices are not staggered on a device basis, and spacing-wider-apart transfer of the light-emitting devices 21 can be achieved with high accuracy.

While the method of transferring devices according to the present invention has been described above, the method is extremely useful when applied, for example, to the transfer of devices in an active matrix type image display system. In the active matrix type image display system, R, G and B light-emitting devices must be arranged adjacently to Si transistors which are driving devices. These R, G and B light-emitting devices must be transferred sequentially to positions near the Si transistor. The Si transistor is extremely high in heat conductivity, and application of heat will lead to breakage of internal circuit. By utilizing the laser light in the transferring method as described above, conduction of heat to the Si transistor can be obviated, so that the above-mentioned inconvenience can be prevented.

In a ninth embodiment, a method of arranging devices by a two-stage spacing-wider-apart transferring method and a method of manufacturing an image display system will be described, as an example of application of the above-described transferring method.

In the method of arranging devices and the method of manufacturing an image display system in this example, two-stage spacing-wider-apart transfer is conducted in which devices fabricated on a first substrate at a high degree of integration are transferred onto a temporary holding member so that they are spaced wider apart as compared with the condition of being arranged on the first substrate, and then the devices held on the temporary holding member are transferred onto a second substrate while being further spaced apart. While the transfer is conducted in two stages in this example, the transfer may be conducted in three or more stages according to the degree of spacing the devices wider apart from each other.

FIG. 10 shows basic steps of the two-stage spacing-wider-apart transferring method. First, devices 12 such as light-emitting devices are densely formed on a first substrate 10 shown in FIG. 10A. By fabricating the devices densely, the number of devices formed per substrate can be increased, and production cost can be lowered. The first substrate 10 is a substrate on which various devices can be formed, such as a semiconductor wafer, a glass substrate, a quartz glass substrate, a sapphire substrate, a plastic substrate and the like, and the devices 12 may be fabricated directly on the first substrate 10 or may be fabricated on another substrate and arranged on the first substrate 10.

Next, as shown in FIG. 10B, the devices 12 are transferred from the first substrate 10 onto a first temporary holding member 11 indicated by broken line in the figure, and are held on the first temporary holding member. Here, the adjacent devices 12 are spaced apart, and are arranged in a matrix form as shown in the figure. Namely, the devices 12 are transferred so that they are spaced wider apart in x direction, and are transferred so that they are spaced wider apart also in y direction orthogonal to the x direction. The interval to which the devices 12 are spaced wider apart is not particularly limited, and may be, for example, an interval determined based on the formation of resin portions and formation of electrode pads in the subsequent steps. It is possible to ensure that all the devices on the first substrate 10 are transferred while being spaced wider apart at the time of transfer from the first substrate 10 onto the first temporary holding member 11. In this case, the size of the first temporary holding member 11 may be any size not less than the size equal to the number (in the x direction and in the y direction) of the devices 12 arranged in the matrix form multiplied by the spaced interval of the devices 12. It is also possible to ensure that part of the devices on the first substrate 10 are transferred onto the first temporary holding member 12 while being spaced wider apart.

After such a first transferring step, as shown in FIG. 10C, the devices 12 present on the first temporary holding member 11 are spaced apart, and covering of the devices 12 with a resin and formation of electrode pads are conducted on a device basis. The covering of the devices 12 with the resin is conducted for facilitating the formation of the electrode pads, for facilitating the handling of the devices 12 in the subsequent second transferring step, and for the like purposes. The formation of the electrode pads is conducted after the second transferring step followed by final wiring, as will be described later. Therefore, the electrode pads are formed in comparatively large size so that defective wiring is not generated. Incidentally, the electrode pads are not shown in FIG. 10C. By covering the individual devices 12 with the resin 13, resin molded chips 14 are formed. The device 12 is located roughly at the center of the resin molded chip 14 in plan view as shown, but it may be present at a position close to one side or one corner of the resin molded chip 14.

Next, as shown in FIG. 10D, a second transferring step is conducted. In the second transferring step, the devices 12 arranged in the matrix form on the first temporary holding member 11 are transferred onto a second substrate 15 while being spaced further apart on the basis of the resin molded chips 14.

The second transferring step is conducted by applying the above-described transferring method according to the present invention, and this will be described in detail later.

In the second transferring step, the adjacent devices 12 are spaced apart on the basis of the resin molded chips 14, and are arranged in a matrix form as shown in the figure. Namely, the devices 12 are transferred so that the devices are spaced wider apart in the x direction, and are transferred so that they are space wider apart also in the y direction orthogonal to the x direction. Where the positions of the devices arranged by the second transferring step are the positions corresponding to the pixels of the final product such as an image display system, a roughly integer fold of the initial pitch of the devices 12 is the pitch of the devices 12 arranged by the second transferring step. The value E of the roughly integer fold is represented by E=n×m, where n is the enlargement factor of the spaced pitch upon transfer from the first substrate 10 onto the first temporary holding member 11, and m is the enlargement factor of the spaced pitch upon transfer from the first temporary holding member 11 onto the second substrate 15.

Wiring is applied to each of the devices 12 spaced apart on the second substrate 15 on the basis of the resin molded chips 14. At this time, wiring with defective connection restrained as much as possible is conducted by utilizing the electrode pads and the like formed previously. In the case where the devices 12 are light-emitting devices such as light-emitting diodes, for example, the wiring includes wires to the p electrodes and n electrodes, and in the case of liquid crystal control devices, the wiring includes wires for selective signal conductors, voltage conductors, orientation electrode films, and the like.

In the two-stage spacing-wider-apart transferring method shown in FIG. 10, the formation of the electrode pads, resin molding and the like can be conducted by utilizing the enlarged spaces upon the first transfer, and the wiring conducted after the second transfer can be conducted while restraining defective connection as much as possible by utilizing the electrode pads and the like formed previously. Therefore, the yield of the image display system can be enhanced. Besides, in the two-stage spacing-wider-apart transferring method, the steps of spacing the devices wider apart are two steps, and by conducting a number of spacing-wider-apart transferring steps for spacing the devices wider apart, the actual number of transferring steps is reduced. Namely, for example, where the enlargement factor of the spaced pitch upon transfer from the first substrate 10 onto the first temporary holding member 11 is 2 (n=2) and the enlargement factor of the spaced pitch upon transfer from the first temporary holding member 11 onto the second substrate 15 is 2 (m=2), the final enlargement factor is 2×2=4 fold. If the devices are to be transferred into the enlarged region by one time of transfer, it is necessary to perform the transfer, namely, alignment of the first substrate $4^2$ or 16 times. On the other hand, in the two-stage spacing-wider-apart transferring method according to the present example, the number of times of alignment required is as small as 8, which is the simple sum of the 4 times required in the first transferring step (enlargement factor is 2, and $2^2$=4) and the 4 times required in the second transferring step (enlargement factor is 2, and $2^2$=4). Namely, since $(n+m)^2=n^2+2$ nm+$m^2$, where the same transfer pitch enlargement factor is intended, it is possible to reduce the number of times of transfer (or alignment) by 2 nm according to the two-stage spacing-wider-apart transferring method of the present invention. Therefore, the production time and cost can be reduced by amounts corresponding to the saved number of times of transfer (or alignment), which is particularly profitable in the case where the enlargement factor of spaced pitch is large.

In the two-stage spacing-wider-apart transferring method shown in FIG. 10, the device 12 has been, for example, a light-emitting device. However, the device 12 is not limited to the light-emitting device, and may be a device selected from other devices, for example, a liquid crystal control device, a photo-electric conversion device, a piezoelectric device, a thin film transistor device, a thin film diode device, a resistance device, a switching device, a micro magnetic device and a micro optical device, or a part of such device, a combination of such devices, and so on.

Figure 11:
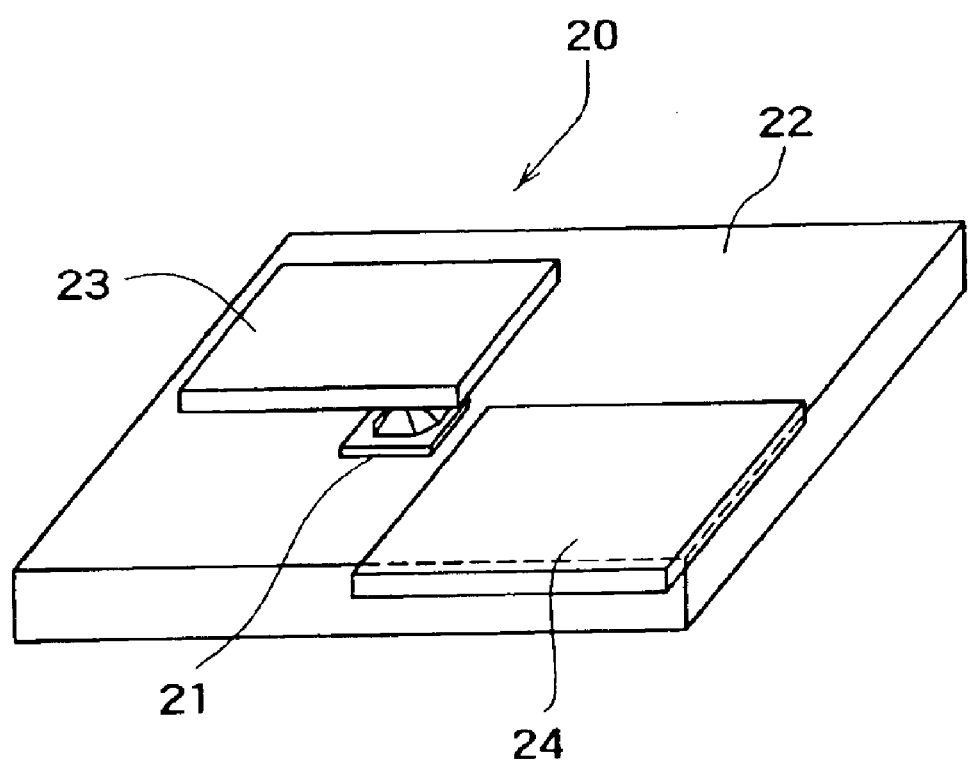
FIG. 11 is a perspective view of a resin molded chip.
Figure 12:
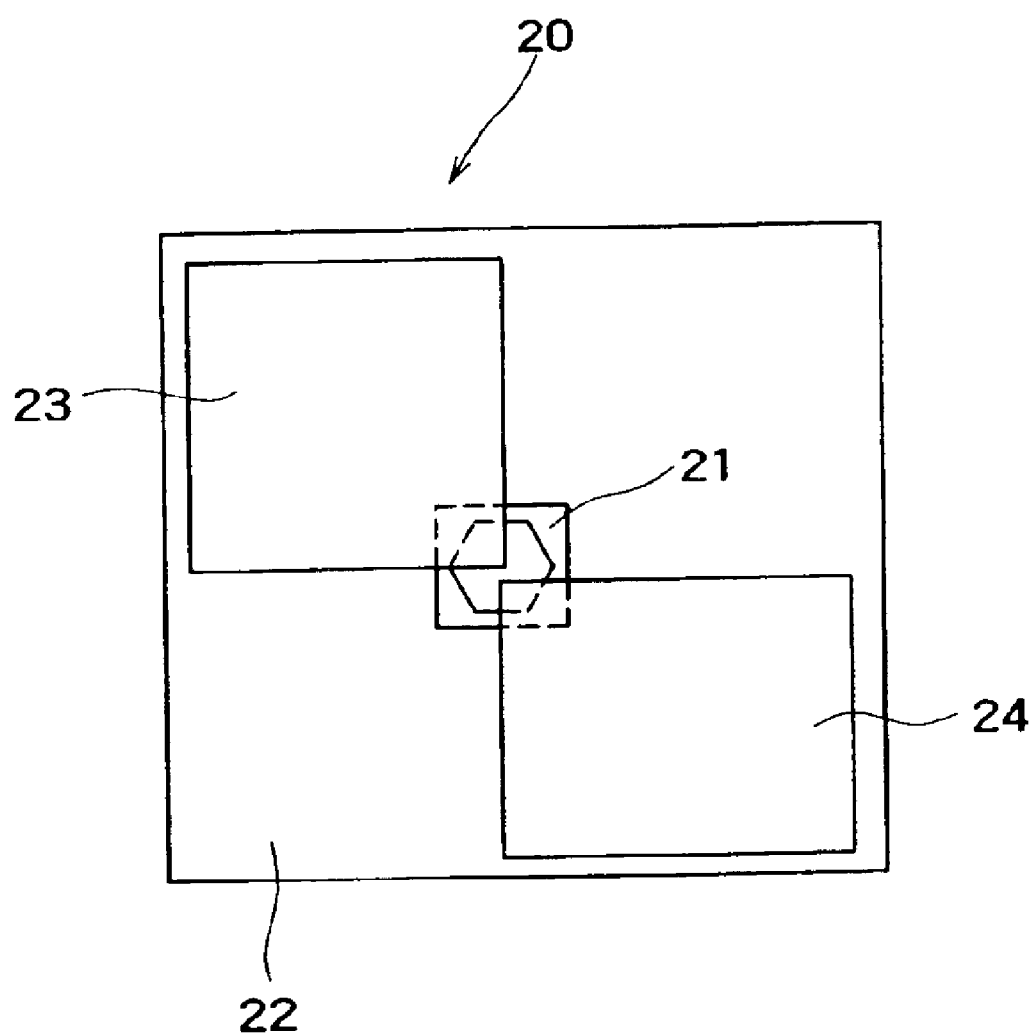
FIG. 12 is a plan view of the resin molded chip.

In the second transferring step, the devices 12 are treated as resin molded chips, which are transferred from the temporary holding member onto the second substrate. The resin molded chips will be described referring to FIGS. 11 and 12.

The resin molded chips 20 are obtained by fixing the surroundings of the devices 21 spaced apart from each other with a resin 22. Such resin molded chips 20 are used at the time of transferring the devices 21 from the temporary holding member onto the second substrate.

The resin molded chip 20 is substantially flat-shaped, and a major surface thereof is roughly square in shape. The shape of the resin molded chip 20 is the shape formed by fixing with the resin 22. In concrete, the shape is obtained when an uncured resin is applied to the entire surface so as to contain each device 21 therein, then the resin is cured, and thereafter each portions are cut by dicing or the like.

Electrode pads 23 and 24 are provided respectively on the face side and the back side of the substantially flat plate-shaped resin 22. The electrode pads 23, 24 are formed by forming a conductive layer such as a metallic layer and a polycrystalline silicon layer to become the electrode pads 23, 24 on the entire surface, and patterning the conductive layer into desired electrode shapes by photolithography. The electrode pads 23, 24 are so formed as to be connected respectively to a p electrode and an n electrode of the device 21 which is a light-emitting device, and, if required, the resin 22 is provided with holes and the like.

While the electrode pads 23, 24 are provided respectively on the face side and the back side of the resin molded chip 20 here, both of the electrode pads may be provided on one side. For example, in the case of a thin film transistor, there are three electrodes corresponding respectively to source, gate and drain, and, therefore, three or more electrode pads may be provided. The positions of the electrode pads 23 and 24 are staggered on the flat plate so that overlapping will not occur when contacts are made from the upper side at the time of final wiring. The shape of the electrode pads 23, 24 is not limited to a square, and may be other suitable shapes.

With such a constitution of the resin molded chip 20, the surroundings of the device 21 are covered with the resin 22, and the attendant planarization ensures that the electrode pads 23, 24 can be formed with high accuracy. Also, the electrode pads 23, 24 can be extended to a wider region as compared with the device 21. Since the final wiring is conducted after the second transferring step, as will be described later, wiring by utilizing the electrode pads 23, 24, which are comparatively large in size, prevents defective wiring.

Figure 13A:
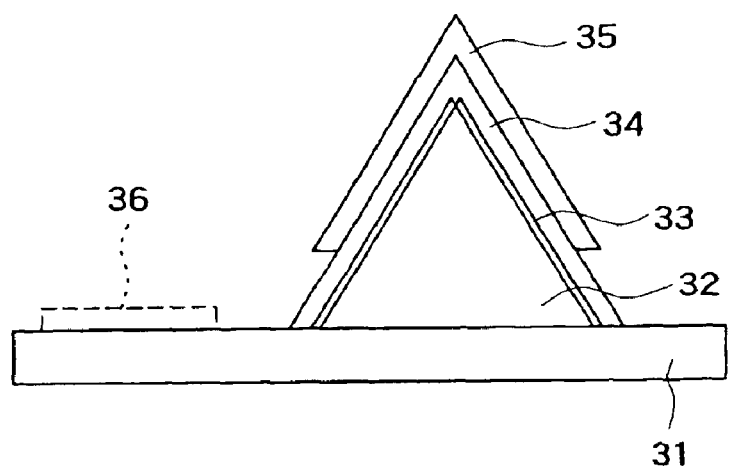
FIGS. 13A to 13B show an example of a light-emitting device, in which 13A is a sectional view, and 13B is a plan view.
Figure 13B:
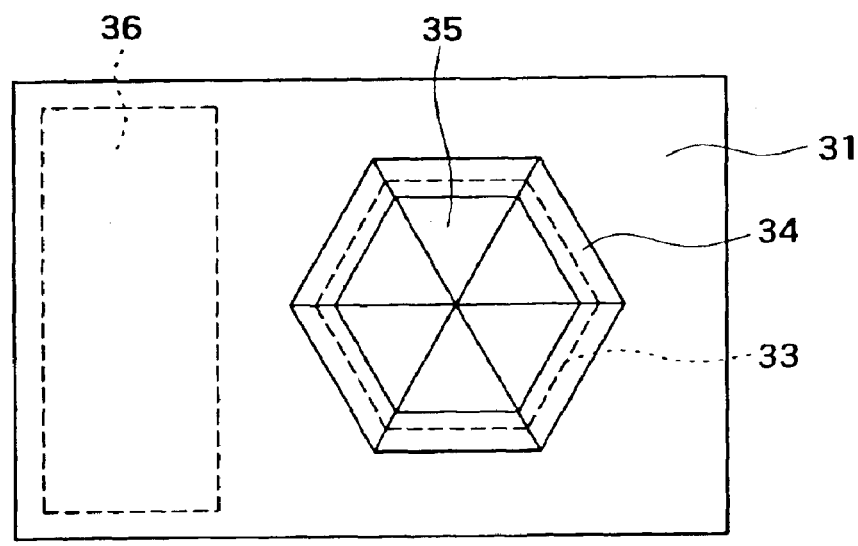

Next, FIG. 13 shows the structure of a light-emitting device as an example of the devices used in the two-stage spacing-wider-apart transferring method according to the present embodiment. FIG. 13A is a sectional view of the device, and FIG. 13B is a plan view of the same. The light-emitting device is a GaN-based light-emitting diode, which is formed by crystal growth, for example, on a sapphire substrate. Such a GaN-based light-emitting diode is characterized in that laser ablation is caused by irradiation with laser light transmitted through the substrate, and exfoliation is generated at the interface between the sapphire substrate and the GaN-based growth layer attendant on the phenomenon of evaporation of nitrogen of GaN, whereby separation of the device is facilitated. The light-emitting device has been described in a seventh embodiment, and detailed description thereof is omitted here.

Next, a concrete technique of the method of arranging the light-emitting devices shown in FIG. 10 will be described, referring to FIGS. 14 to 20. As the light-emitting device, the GaN-based light-emitting diode shown in FIG. 13 is used.

Figure 14:
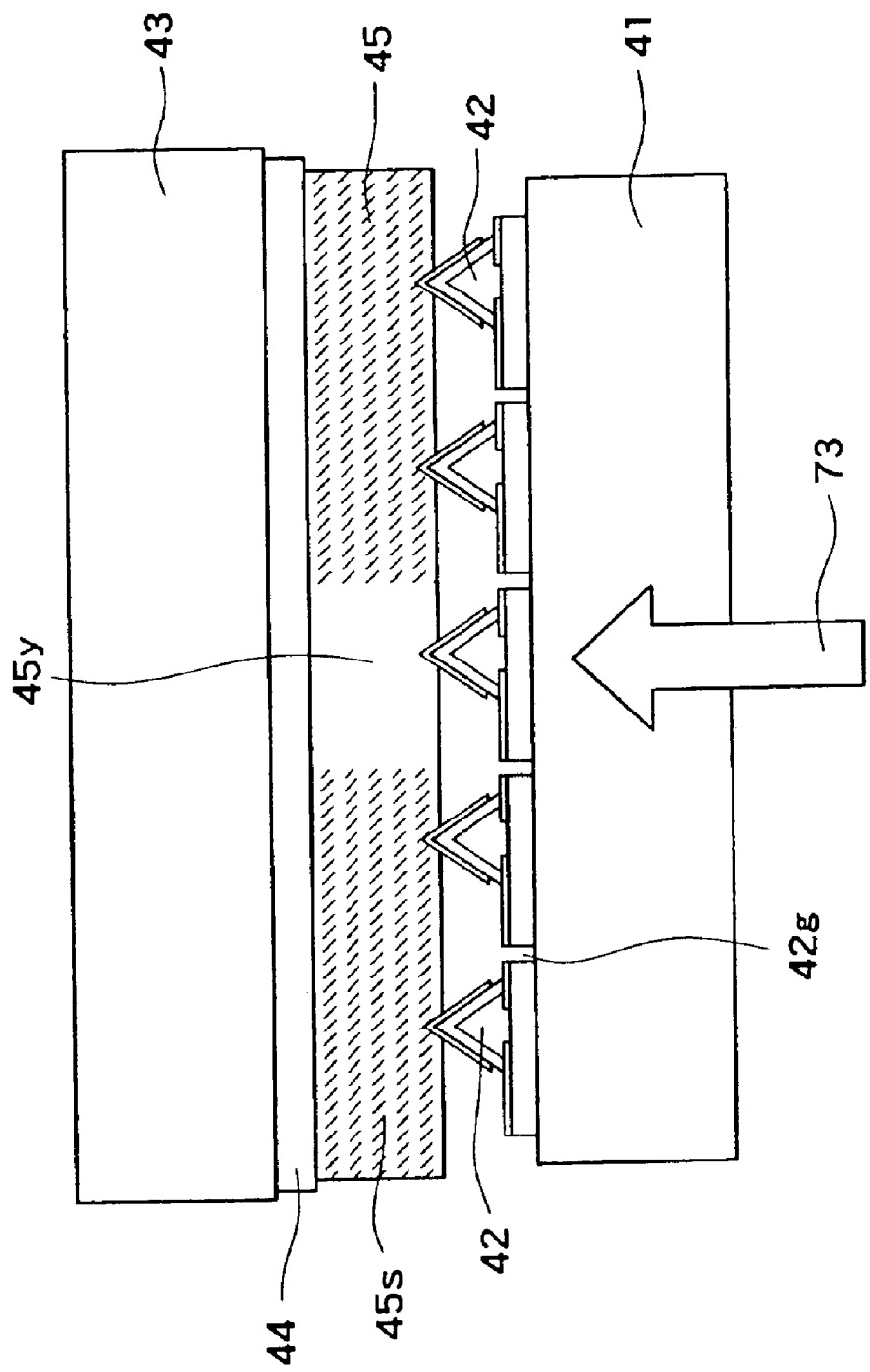
FIG. 14 is a sectional view showing a first transferring step.

First, as shown in FIG. 14, a number of light-emitting diodes 42 are provided in a matrix form on a major surface of a first substrate 41. The size of the light-emitting diodes 42 can be about 20 $\mu$m. As the material constituting the first substrate 41, a material having a high transmittance at the wavelength of laser light with which the light-emitting diodes 42 are irradiated, such as a sapphire substrate, is used.

The light-emitting diode 42 is already formed with a p electrode and the like, but final wiring is not yet conducted, and grooves 42g for separation between the devices are provided, so that the individual light-emitting diodes 42 are in a separable condition. The grooves 42g are formed, for example, by reactive ion etching. Such a first substrate 41 is opposite to a first temporary holding member 43, and selective transfer is conducted as shown in FIG. 14.

A release layer 44 and an adhesive layer 45 are provided in a double layer structure on a surface of the first temporary holding member 43, which is opposite to the first substrate 41. Here, examples of the first temporary holding member 43 include a glass substrate, a quartz glass substrate, a plastic substrate and the like, while examples of the release layer 44 on the first temporary holding member 43 include a fluoro coat, a silicone resin, a water-soluble adhesive (for example, polyvinyl alcohol (PVA)), a polyimide and the like.

As the adhesive layer 45 of the first temporary holding member 43, a layer of any of an ultraviolet (UV) curable type adhesive, a thermosetting adhesive, and a thermoplastic adhesive can be used. As an example, a quartz glass substrate is used as the first temporary holding member 43, a polyimide layer is formed in a thickness of 4 μm as the release layer 44, and a UV-curable type adhesive is applied in a thickness of about 20 μm as the adhesive layer 45.

The adhesive layer 45 of the first temporary holding member 43 is so conditioned as to have cured regions 45s and uncured regions 45y in a mixed state, and positioning is conducted so that the light-emitting diodes 42 to be transferred are located in the uncured regions 45y. The conditioning to produce the cured regions 45s and the uncured regions 45y in a mixed state may be conducted, for example, by subjecting the UV-curable type adhesive to selective UV exposure at a pitch of 200 μm by an exposure machine so that the regions of transfer of the light-emitting diode 42 are uncured and the other regions are cured. After such an alignment, the light-emitting diodes 42 to be transferred are irradiated with laser light 73 from the back side of the first substrate 41, whereby these light-emitting diodes 42 are exfoliated from the first substrate 41 by utilizing laser ablation. The GaN-based light-emitting diodes 42 can be released relatively easily, because GaN is decomposed into metallic Ga and nitrogen at the interface between GaN and sapphire. The laser light 73 used for irradiation may be excimer laser, higher harmonic YAG laser or the like.

By the exfoliation utilizing the laser ablation, the light-emitting diodes 42 to be irradiated are separated at the interface between the GaN layer and the first substrate 41, and are transferred in the manner of piercing the p electrode portions into the adhesive layer 45 on the opposite side. The other light-emitting diodes 42 located in the regions not irradiated with the laser light 73 correspond to the cured regions 45s of the adhesive layer 45, and are not irradiated with the laser light 73, so that they are not transferred to the side of the first temporary holding member 43. While only one light-emitting diode 42 is selectively irradiated with the laser light in FIG. 14, the light-emitting diodes 42 in the regions spaced from the one light-emitting diode 42 by n pitches are also irradiated with the laser light. By such a selective transfer, the light-emitting diodes 42 are arranged on the first temporary holding member 43 in the state of being spaced wider apart as compared with the condition of being arranged on the first substrate 41.

Figure 15:
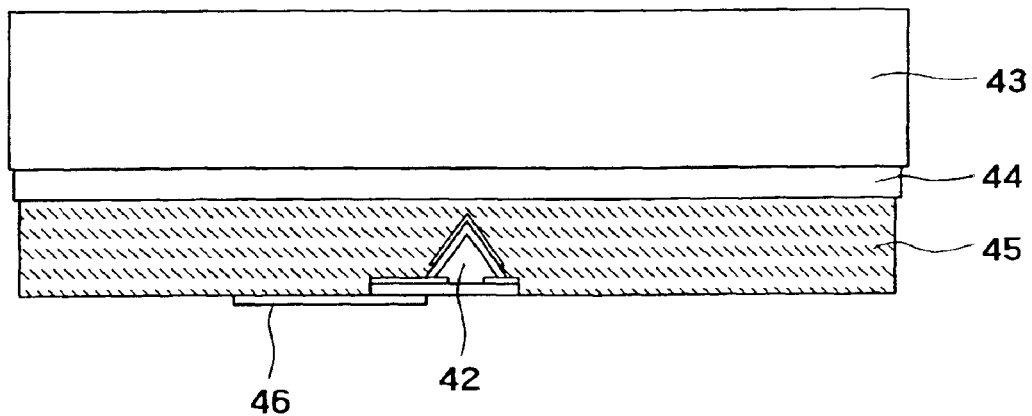
FIG. 15 is a sectional view showing a step of forming electrode pads.

In the condition where the light-emitting diode 42 is held on the adhesive layer 45 of the first temporary holding member 43, the back side of the light-emitting diode 42 is the n electrode side (cathode side), and the back side of the light-emitting diode 42 is deprived of resin (adhesive) by cleaning, so that when an electrode pad 46 is formed as shown in FIG. 15, the electrode pad 46 is in electrical connection with the bask surface of the light-emitting diode 42.

Cleaning of the adhesive layer 45 is conducted, for example, by etching the adhesive resin with oxygen plasma, followed by cleaning though irradiation with UV ozone. When the GaN-based light-emitting diode is released from the first substrate 41 consisting of a sapphire substrate by irradiation with laser light, Ga is precipitated on the release surface. Therefore, etching of Ga is needed. This etching is conducted by use of an aqueous NaOH solution or diluted hydrochloric acid. Thereafter, the electrode pad 46 is patterned. At this time, the electrode pad on the cathode side may be about 60 μm square. As the electrode pad 46, a transparent electrode (ITO, ZnO, etc.) or such material as Ti/Al/Pt/Au is used. In the case of the transparent electrode, light emission is not intercepted even when the back side of the light-emitting diode is covered in a large area, so that rough patterning precision and formation of a larger electrode are permitted, and the patterning process is facilitated.

FIG. 16 shows the condition where the light-emitting diodes 42 are transferred from the first temporary holding member 43 onto a second temporary holding member 47, where holes 50 on the side of anodes (p electrodes) are formed, then anode-side electrode pads 49 are formed, and the adhesive layer 45 consisting of a resin is diced. As a result of the dicing, device separation grooves 51 are formed, whereby the light-emitting diodes 42 are demarcated on a device basis. In order to separate the individual light-emitting diodes 42 arranged in a matrix form, the device separation grooves 51 in a plain surface pattern are composed of a number of parallel lines extended in a crossing manner. At bottom portions of the device separation grooves 51, the surface of the second temporary holding member 47 is exposed.

A release layer 48 is provided on the second temporary holding member 47. The release layer 48 can be formed, for example, by use of a fluoro coat, a silicone resin, a water-soluble adhesive (for example, PVA), a polyimide or the like. The second temporary holding member 47 may be, for example, a so-called dicing sheet in which a UV pressure sensitive adhesive is applied to a plastic substrate, and of which the tack is lowered upon irradiation with UV rays.

At the time of transfer from the first temporary holding member 43 onto the second temporary holding member 47, irradiation with excimer laser light is conducted from the back side of the temporary holding member 43 provided with the release layer 44. In the case where, for example, a polyimide is used as the release layer 44, the irradiation with the excimer laser light causes exfoliation at the interface between the polyimide and the quartz substrate through ablation, and each of the light-emitting diodes 42 is transferred to the side of the second temporary holding member 47.

At the time of forming the anode-side electrode pads 49, the surface of the adhesive layer 45 is etched with oxygen plasma until the surfaces of the light-emitting diodes 42 are exposed. The holes 50 can be formed by use of excimer laser, higher harmonic YAG laser or carbon dioxide gas laser. At this time, the holes are opened with a diameter of about 3 to 7 μm. The anode-side electrode pads are formed of Ni/Pt/Au or the like. The dicing process may be conducted by use of a conventional blade, or may be conducted by use of the above-mentioned laser where cuts of not more than 20 μm in width are required. The width of the cuts depends on the size of the light-emitting diode 42 covered with the adhesive layer 45 consisting of a resin in each pixel of an image display system.

Next, the light-emitting diodes 42 are transferred from the second temporary holding member 47 onto a second substrate 60. To this transfer, the above-described transferring method is applied. Namely, a pressure sensitive adhesive layer 53 is preliminarily provided on a major surface of a third temporary holding member 52, and a UV-curable resin layer 53 and the upper surfaces of the light-emitting diodes 42, namely, the side of the anode-side electrode pads 49 are opposite to and brought into contact with each other, as shown in FIG. 17. In this condition, the resin molded chips (the light-emitting diodes 42 and the adhesive layer 45) to be transferred are selectively irradiated with excimer laser light 54 from the back side of the second temporary holding member 47 by use of a mask 55. Where, for example, the second temporary holding member 47 consists of a quartz substrate and the release layer 48 is formed of a polyimide, the irradiation causes exfoliation through ablation of the polyimide at the interface between the polyimide and the quartz substrate, whereby the resin molded chips to be transferred are made to be releasable. Then, the third temporary holding member 52 is stripped from the second temporary holding member 47, whereby the resin molded chips are selectively transferred from the second temporary holding member 47 onto the third temporary holding member 52.

Figure 18:
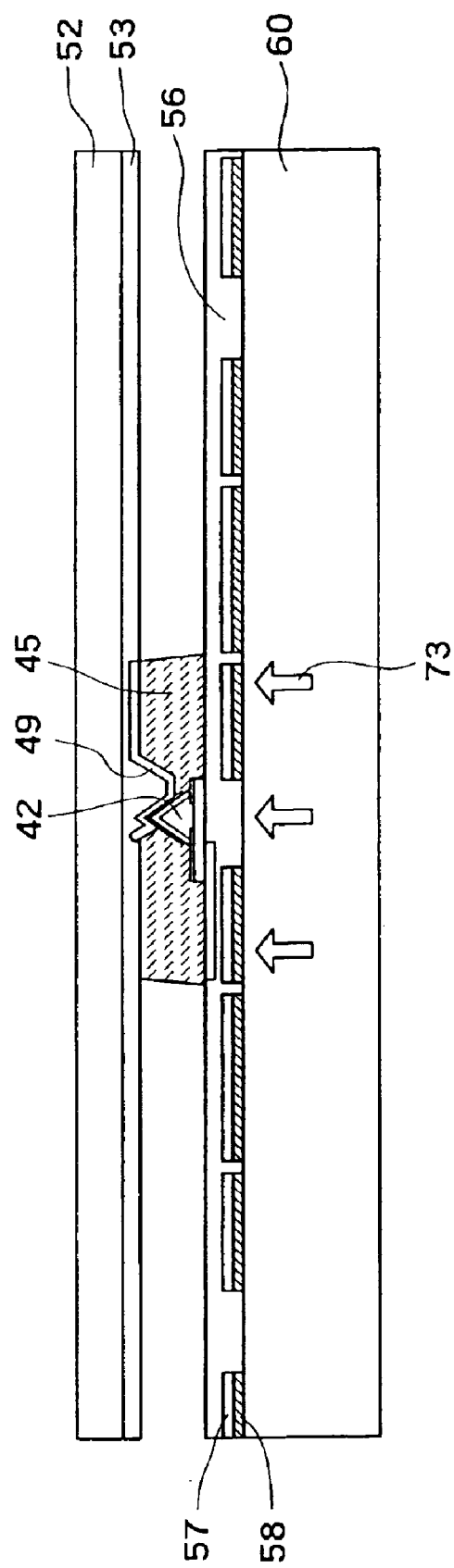
FIG. 18 is a sectional view showing an example of the second transferring step.

Next, a thermoplastic adhesive layer 56 is preliminarily provided on the second substrate 60, and the third temporary holding member 52 and the second substrate 60 are so disposed that the light-emitting diodes 42 and the second substrate 60 are disposed in a desired positional relationship, with the light-emitting diodes 42 and the thermoplastic adhesive layer 60 are opposite to each other, as shown in FIG. 18. Then, as shown in FIG. 18, irradiation with laser light 73 is conducted from the back side of the second substrate 60, whereby only the portions of the thermoplastic adhesive layer 56 corresponding to the resin molded chips to be transferred are heated. By the irradiation with the laser light 73, the thermoplastic adhesive layer 56 is softened at the positions corresponding to the resin molded chips.

Subsequently, the thermoplastic adhesive layer 56 is cooled and cured, whereby the resin molded chips are fixed on the second substrate 60. At this time, the tack of the pressure sensitive adhesive layer 53 is set to be lower than the adhesive force of the thermoplastic adhesive layer 56 upon curing. Thus, stripping of the third temporary holding member 52 from the second substrate 60 causes the resin molded chips, namely, the light-emitting diodes 42 to be selectively transferred onto the second substrate 60.

In addition, a method may be adopted in which an electrode layer 57 functioning also as a shadow mask is provided on the second substrate 60, and the electrode layer 57 is heated by irradiation with laser light 73, whereby the thermoplastic adhesive layer 56 is indirectly heated. Particularly, when a black chromium layer 58 is provided on the surface of the electrode layer 57 on the screen side, namely, on the side of the viewer of the image display system, as shown in FIG. 18, picture contrast can be enhanced, and absorbance of energy at the black chromium layer 58 is enhanced, whereby the thermoplastic adhesive layer 56 can be efficiently heated by the selective irradiation with the laser light 73.

Figure 19:
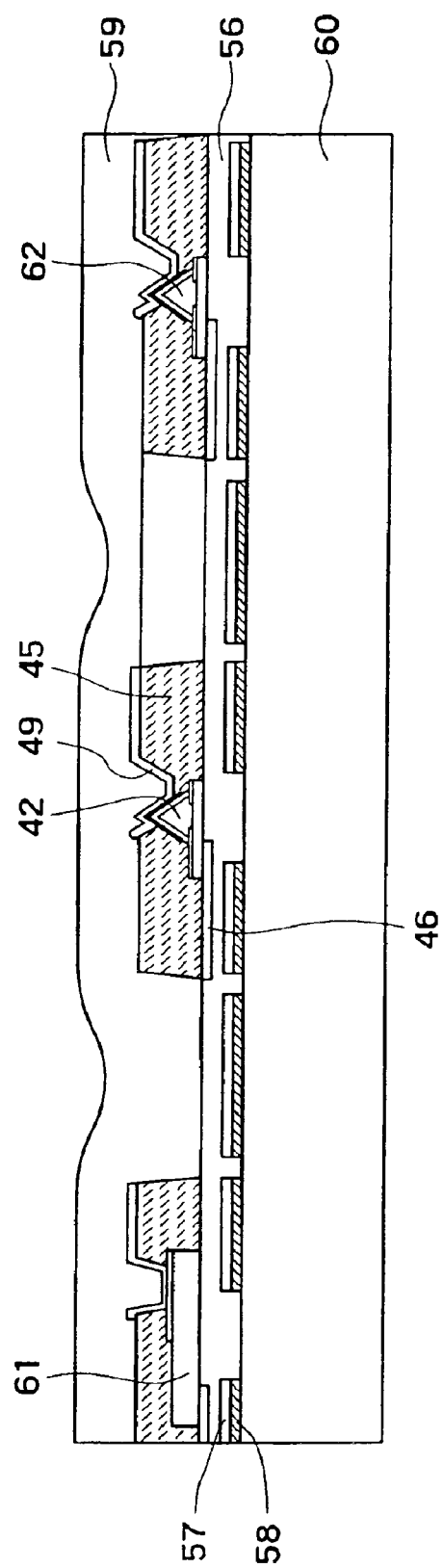
FIG. 19 is a sectional view showing a step of forming an insulation layer.

FIG. 19 shows the condition where light-emitting diodes 42, 61, 62 for three colors of R, G and B are provided on the second substrate 60 and an insulation layer 59 is applied thereto. When the light-emitting diodes 42, 61, 62 are mounted on the second substrate 60 in the state of being staggered to color positions by the above-mentioned transferring method, three-color pixels can be formed while maintaining a constant pixel pitch. The insulation layer 59 may be formed of a transparent epoxy adhesive, a UV-curable type adhesive, a polyimide or the like. The three color light-emitting diodes 42, 61, 62 need not be the same in shape. In FIG. 19, the red light-emitting diode 61 has a structure not having a hexagonal pyramid shaped GaN layer and is different from the other light-emitting diodes 42, 62 in shape; in this stage, however, the light-emitting diodes 42, 61, 62 have already been covered with the adhesive layer 45 consisting of a resin to be resin molded chips, so that they can be handled in the same manner notwithstanding the differences in device structure.

Figure 20:
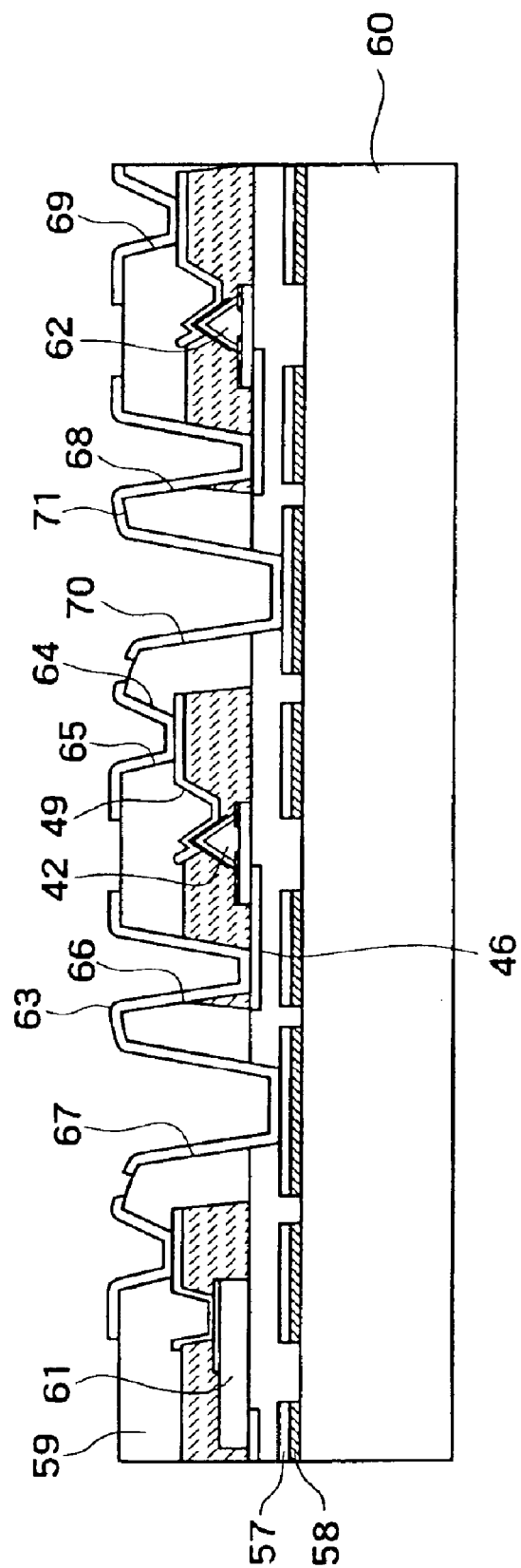
FIG. 20 is a general sectional view showing a wiring forming step.
Figures 21A, 21B:
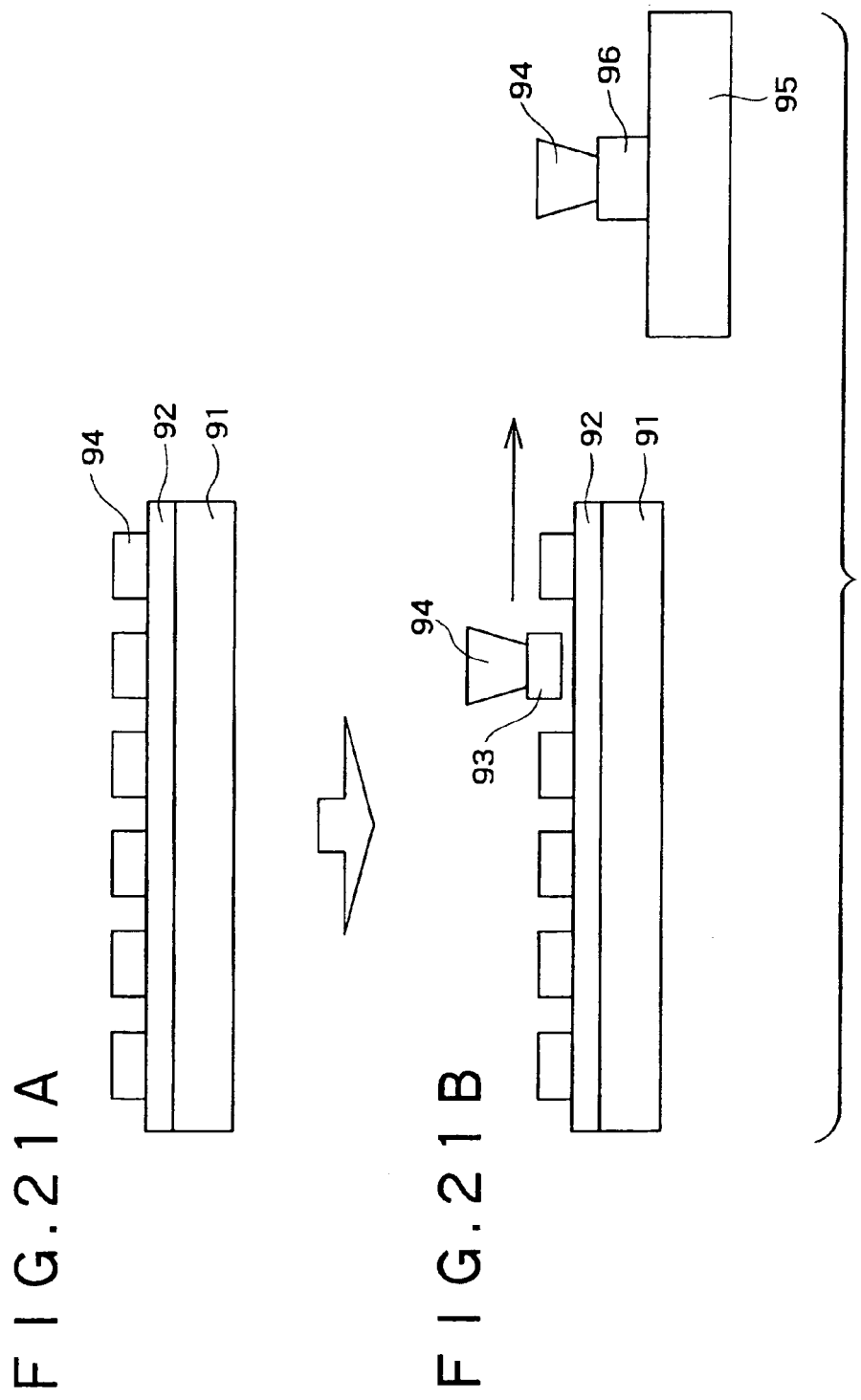
FIGS. 21A to 21B show general sectional views illustrating a conventional method of transferring a device or devices.

FIG. 20 shows a wiring forming step. In the figure, an insulation layer 59 is provided with opening portions 65, 66, 67, 68, 69, 70, and wires 63, 64, 71 for connecting anode-side and cathode-side electrode pads of the light-emitting diodes 42, 61, 62 and the wiring electrode layer 57 of the second substrate 60 are formed. The opening portions, namely, the holes formed at this time may be large in size, since the electrode pads 46, 49 of the light-emitting diodes 42, 61, 62 are large in area. Also, the positional precision of the holes may be rough as compared with holes provided directly in the light-emitting diodes. The holes may be about 20 μm in diameter for the electrode pads 46, 49 of about 60 μm square in size. As for the depth of the holes, there are three depths, one for connection with a wiring substrate, one for connection with anodes, and one for connection with cathodes. Therefore, the holes are opened with optimum depths by controlling the pulse number of laser. Thereafter, a protective film is provided on the wires, whereby a panel of the image display system is completed. The protective layer may be formed of a transparent epoxy adhesive or the like, in the same manner as the insulation layer 59 shown in FIG. 19. The protective layer is cured by heating, and covers the wires entirely. Thereafter, a driver IC is connected with the wires at an end portion of the panel, whereby a driving panel is manufactured.

In the method of arranging the light-emitting devices as described above, at the time when the light-emitting diodes 42 are held on the first temporary holding member 43, the interval between the devices is already large, and the electrode pads 46, 49, which are comparatively large in size, can be provided by utilizing the enlarged interval. Since wiring is conducted by utilizing the electrode pads 46, 49 comparatively large in size, the wires can be easily formed even where the size of the final system is extremely large as compared with the device size. In addition, in the method of arranging the light-emitting device according to the present example, the surroundings of the light-emitting diodes are covered with the adhesive layer 45 and are planarized, whereby the electrode pads 46, 49 can be formed with high accuracy. Besides, at the time of transfer of the light-emitting diodes 42 onto the first temporary holding member 43, the decomposition of the GaN-based material into metallic Ga and nitrogen at the interface between the GaN-based material and sapphire is utilized, whereby the light-emitting diodes 42 can be released comparatively easily, and can be transferred assuredly. Furthermore, at the time of transfer of the resin molded chips onto the second substrate (second transferring step), the release layer 48 is selectively irradiated with excimer laser light 54, whereby only the resin molded chips to be transferred are selectively made to be releasable. Therefore, only the resin molded chips to be transferred can be transferred securely, without affecting the other component parts.

It should be understood that various changes and modifications to the presently preferred embodiment described herein will be apparent to those skilled in the art. Such changes and modifications can be made without departing from the spirit and scope of the invention and without diminishing its intended advantages. It is therefore intended that such changes and modifications be covered by the appended claims.

The invention is claimed as follows:

1. A method of transferring a plurality of devices arranged on a first substrate onto a second substrate, comprising the steps of:

transferring the devices to a first temporary holding member so the devices are spaced wider apart compared with a spacing of the devices on the first substrate;

fixing the devices to the first temporary holding member with a resin;

dicing the resin to separate the fixed devices; and transferring the devices from the first temporary holding member onto the second substrate while spacing the devices further apart from each other, wherein the step of transferring the devices from the first temporary holding member comprises the steps of:

making the devices to be transferred releasable from a second temporary holding member; and transferring the releasable devices from the second temporary holding member onto the second substrate including an adhesive layer.

2. A method of transferring the devices as set forth in claim 1, wherein at least one of the devices is a semiconductor device using a nitride semiconductor.

3. A method of transferring one or more devices as set forth in claim 1, wherein at least one of the devices is a device selected from the group consisting of: a light-emitting device, a liquid crystal control device, a photoelectric conversion device, a piezoelectric device, a thin film transistor device, a thin film diode device, a resistance device, a switching device, a micro magnetic device, and a micro optical device.

4. A method of manufacturing an image display system having a plurality of light-emitting devices arranged in a matrix form, the method comprising the steps of:

transferring the light-emitting devices to a first temporary holding member so that the devices are spaced wider apart from each other compared with a spacing of the devices on a first substrate;

fixing the light-emitting devices on the first temporary holding member using a resin;

dicing the resin on a light-emitting device basis to separate the resin-fixed light-emitting devices from the first temporary holding member; and transferring the light-emitting devices from the first temporary holding member onto a second substrate while spacing the light-emitting devices further apart from each other, wherein the step of transferring the light-emitting devices from the first temporary holding member comprises the steps of:

making the light-emitting devices to be transferred releasable from a second temporary holding member; and transferring the releasable light-emitting devices from the second temporary holding member onto the second substrate including an adhesive layer.

* * * * *